(12) United States Patent
Roohparvar

(10) Patent No.: US 6,304,497 B1
(45) Date of Patent: Oct. 16, 2001

(54) SYNCHRONOUS MEMORY STATUS REGISTER

(75) Inventor: Frankie F. Roohparvar, Miltitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/609,207

(22) Filed: Jun. 30, 2000

(51) Int. Cl.$^7$ ........................................................ G11C 7/00
(52) U.S. Cl. ................................. 365/194.04; 365/189.12
(58) Field of Search ........................... 365/189.04, 189.12

(56) References Cited

U.S. PATENT DOCUMENTS

| | | |
|---|---|---|
| 5,041,886 | 8/1991 | Lee . |
| 5,450,363 | * 9/1995 | Christopherson et al. .......... 365/205 |
| 5,515,317 | * 5/1996 | Wells et al. ........................... 395/427 |
| 5,526,364 | 6/1996 | Roohparvar . |
| 5,537,354 | 7/1996 | Mochizuki et al. . |
| 5,600,605 | 2/1997 | Schaefer . |
| 5,615,159 | 3/1997 | Roohparvar . |
| 5,619,461 | 4/1997 | Roohparvar . |
| 5,666,321 | 9/1997 | Schaefer . |
| 5,675,540 | 10/1997 | Roohparvar . |
| 5,677,885 | 10/1997 | Roohparvar . |
| 5,751,039 | 5/1998 | Kauffman et al. . |
| 5,787,457 | 7/1998 | Miller et al. . |
| 5,825,782 | 10/1998 | Roohparvar . |
| 5,933,434 | 8/1999 | Roohparvar . |
| 5,936,903 | 8/1999 | Jeng et al. . |
| 5,995,438 | 11/1999 | Jeng et al. . |
| 6,026,465 | 2/2000 | Mills et al. . |
| 6,028,798 | 2/2000 | Roohparvar . |
| 6,073,204 | 6/2000 | Lakhani et al. . |
| 6,097,637 | * 8/2000 | Bauer et al. ...................... 365/185.24 |
| 6,137,133 | 10/2000 | Kauffman et al. . |
| 6,141,247 | 10/2000 | Roohparvar et al. . |

OTHER PUBLICATIONS

Micron Semiconductor Products, Inc., "2Mb, Smart 5 BIO-S–Optimized Boot Block Flash Memory," *Flash Memory* www.micron.com, copyright 2000, Micron Technology, Inc., pp. 1–12.

Micron, "16 Mb: x16 SDRAM" *Synchronous DRAM*, www.micron.com, copyright 1999 Micron Technology, Inc., pp. 1–51.

* cited by examiner

*Primary Examiner*—Son T. Dinh
(74) *Attorney, Agent, or Firm*—Fogg, Slifer & Polglaze, P.A.; Russell D. Slifer

(57) ABSTRACT

A synchronous flash memory includes an array of non-volatile memory cells. The memory device has a package configuration that is compatible with an SDRAM. In one embodiment, the present invention can include a memory device comprising an array of memory cells arranged in addressable blocks and an n-bit status register. The memory includes a control circuit coupled to the n-bit status register to program a first bit of the n-bits to a first state indicating if a program operation is being performed on the array. The control circuit further programs second and third bits of the n-bits to identify one of the addressable blocks while the array is being programmed. A method of operating a memory device includes initiating a write operation on a first programmable location of the memory device using a first processor, and reading a status from status data stored in the memory device during the write operation. The status indicates an identification of the first programmable location.

31 Claims, 23 Drawing Sheets

SYNCHRONOUS MEMORY STATUS REGISTER

TECHNICAL FIELD OF THE INVENTION

The present invention relates generally to non-volatile memory devices and in particular the present invention relates to a synchronous non-volatile flash memory.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCS have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile. Many computer systems are designed to operate using SDRAM, but would benefit from non-volatile memory.

For the reasons stated above, and for other reasons stated below which will become apparent to those skilled in the art upon reading and understanding the present specification, there is a need in the art for a non-volatile memory device that can operate in a manner similar to SDRAM operation.

SUMMARY OF THE INVENTION

The above-mentioned problems with memory devices and other problems are addressed by the present invention and will be understood by reading and studying the following specification.

In one embodiment, a memory device comprises an array of memory cells arranged in addressable blocks, an n-bit status register, and a control circuit coupled to the n-bit status register to program a first bit of the n-bits to a first state indicating if a program operation is being performed on the array. The control circuit further programs second and third bits of the n-bits to identify one of the addressable blocks while the array is being programmed.

In another embodiment, a memory system comprises a memory controller, and a memory device coupled to the memory controller. The memory device comprises an array of memory cells arranged in addressable blocks, an n-bit status register, a plurality of programmable non-volatile registers, and control circuitry coupled to the n-bit status register to program a first bit of the status register to a indicate a programming status of the memory device. The control circuit further programs second and third bits of the status register to identify one of the addressable blocks or one of the plurality of programmable non-volatile registers.

One method of operating a memory device is provided. The method comprises modifying first data stored in a status register of the memory device to a first data state to indicate that a write operation is being performed on the memory device, and modifying second data stored in the status register of the memory device to indicate a location of programmable circuitry in the memory device accessed during the write operation.

Another method of operating a memory device comprises initiating a write operation on a first programmable location of the memory device using a first processor, and reading a status from status data stored in the memory device during the write operation. The status indicates an identification of the first programmable location.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The following detailed description is divided into two major sections. The first section is an Interface Functional Description that details compatibility with an SDRAM memory. The second major section is a Functional Description that specifies flash architecture functional commands.

INTERFACE FUNCTIONAL DESCRIPTION

Figure 1A:
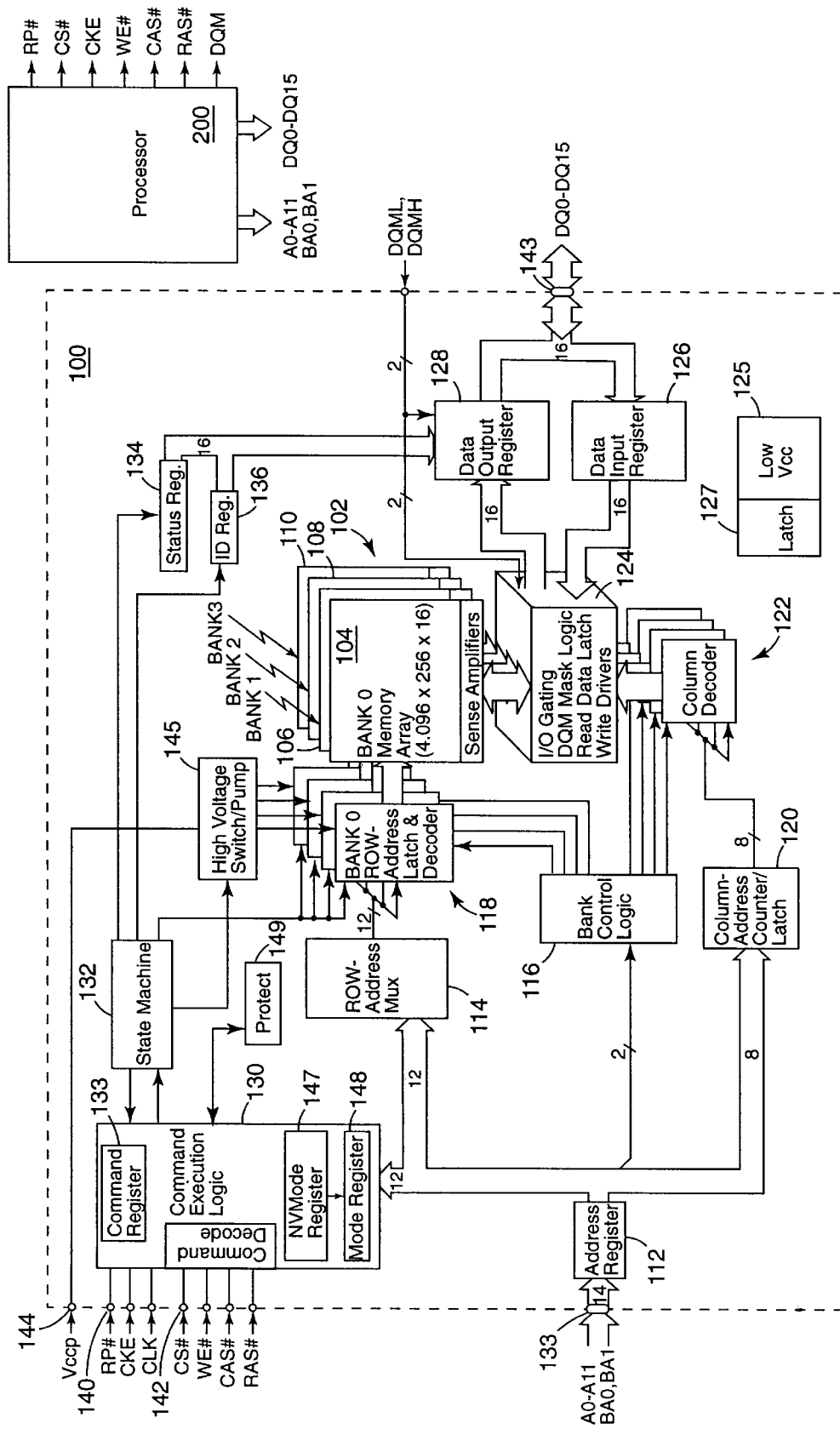
FIG. 1A is a block diagram of a synchronous flash memory of the present invention.

Referring to FIG. 1A, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128. Command execution logic 130 is provided to control the basic operations of the memory device. A state machine 132 is also provided to control specific operations performed on the memory arrays and cells. A status register 134 and an identification register 136 can also be provided to output data.

Figure 1B:
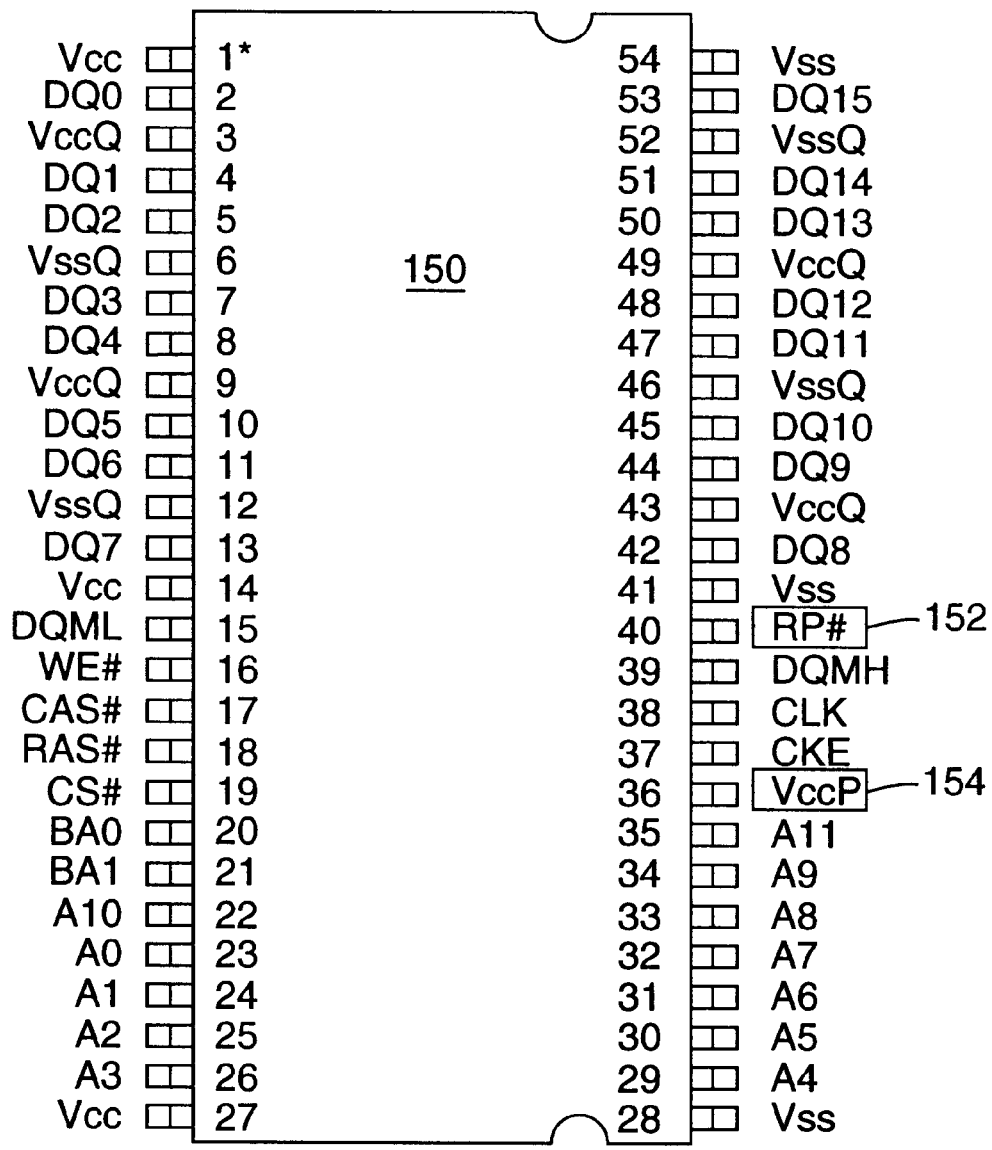
FIG. 1B is an integrated circuit pin interconnect diagram of one embodiment of the present invention.
Figure 1C:
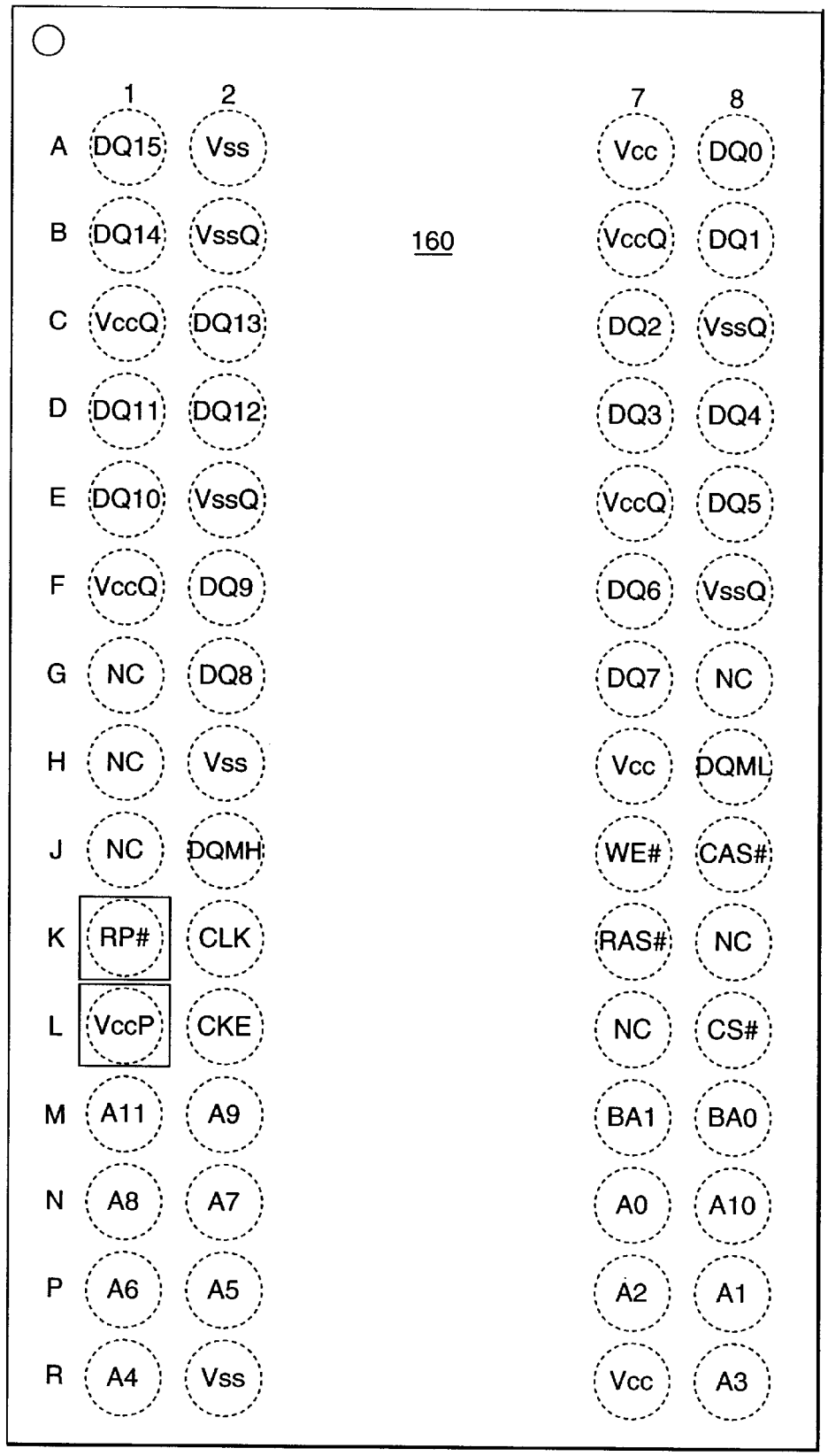
FIG. 1C is an integrated circuit interconnect bump grid array diagram of one embodiment of the present invention.

FIG. 1B illustrates an interconnect pin assignment of one embodiment of the present invention. The memory package 150 has 54 interconnect pins. The pin configuration is substantially similar to available SDRAM packages. Two interconnects specific to the present invention are RP#152 and Vccp 154. Although the present invention may share interconnect labels that are appear the same as SDRAM's, the function of the signals provided on the interconnects are described herein and should not be equated to SDRAM's unless set forth herein. FIG. 1C illustrates one embodiment of a memory package 160 that has bump connections instead of the pin connections of FIG. 1C. The present invention, therefore, is not limited to a specific package configuration.

Prior to describing the operational features of the memory device, a more detailed description of the interconnect pins and their respective signals is provided. The input clock connection is used to provide a clock signal (CLK). The clock signal can be driven by a system clock, and all synchronous flash memory input signals are sampled on the positive edge of CLK. CLK also increments an internal burst counter and controls the output registers.

The input clock enable (CKE) connection is used to activate (HIGH state) and deactivates (LOW state) the CLK signal input. Deactivating the clock input provides POWER-DOWN and STANDBY operation (where all memory banks are idle), ACTIVE POWER-DOWN (a memory row is ACTIVE in either bank) or CLOCK SUSPEND operation (burst/access in progress). CKE is synchronous except after the device enters power-down modes, where CKE becomes asynchronous until after exiting the same mode. The input buffers, including CLK, are disabled during power-down modes to provide low standby power. CKE may be tied HIGH in systems where power-down modes (other than RP# deep power-down) are not required.

The chip select (CS#) input connection provides a signal to enable (registered LOW) and disable (registered HIGH) a command decoder provided in the command execution logic. All commands are masked when CS# is registered HIGH. Further, CS# provides for external bank selection on systems with multiple banks, and CS# can be considered part of the command code; but may not be necessary.

The input command input connections for RAS#, CAS#, and WE# (along with CAS#, CS#) define a command that is to be executed by the memory, as described in detail below. The input/output mask (DQM) connections are used to provide input mask signals for write accesses and an output enable signal for read accesses. Input data is masked when DQM is sampled HIGH during a WRITE cycle. The output buffers are placed in a high impedance (High-Z) state (after a two-clock latency) when DQM is sampled HIGH during a READ cycle. DQML corresponds to data connections DQ0–DQ7 and DQMH corresponds to data connections DQ8–DQ15.DQML and DQMH are considered to be the same state when referenced as DQM.

Address inputs 133 are primarily used to provide address signals. In the illustrated embodiment the memory has 12 lines (A0–A11). Other signals can be provided on the address connections, as described below. The address inputs are sampled during an ACTIVE command (row-address A0–A11) and a READ/WRITE command (column-address A0–A7) to select one location in a respective memory bank. The address inputs are also used to provide an operating code (OpCode) during a LOAD COMMAND REGISTER operation, explained below. Address lines A0–A11 are also used to input mode settings during a LOAD MODE REGISTER operation.

An input reset/power-down (RP#) connection 140 is used for reset and power-down operations. Upon initial device power-up, a 100 μs delay after RP# has transitioned from LOW to HIGH is required in one embodiment for internal device initialization, prior to issuing an executable command. The RP# signal clears the status register, sets the internal state machine (ISM) 132 to an array read mode, and places the device in a deep power-down mode when LOW. During power down, all input connections, including CS# 142, are "Don't Care" and all outputs are placed in a High-Z state. When the RP# signal is equal to a VHH voltage (5V), all protection modes are ignored during WRITE and ERASE. The RP# signal also allows a device protect bit to be set to 1 (protected) and allows block protect bits of a 16 bit register, at locations 0 and 15 to be set to 0 (unprotected) when brought to VHH. The protect bits are described in more detail below. RP# is held HIGH during all other modes of operation.

Bank address input connections, BA0 and BA1 define which bank an ACTIVE, READ, WRITE, or BLOCK PROTECT command is being applied. The DQ0–DQ15 connections 143 are data bus connections used for bi-directional data communication. Referring to FIG. 1B, a VCCQ connection is used to provide isolated power to the DQ connections to improved noise immunity. In one embodiment, VCCQ=Vcc or 1.8V ±0.15V. The VSSQ connection is used to isolated ground to DQs for improved noise immunity. The VCC connection provides a power supply, such as 3V. A ground connection is provided through the Vss connection. Another optional voltage is provided on the VCCP connection 144. The VCCP connection can be tied externally to VCC, and sources current during device initialization, WRITE and ERASE operations. That is, writing or erasing to the memory device can be performed using a VCCP voltage, while all other operations can be performed with a VCC voltage. The Vccp connection is coupled to a high voltage switch/pump circuit 145.

The following sections provide a more detailed description of the operation of the synchronous flash memory. One embodiment of the present invention is a nonvolatile, electrically sector- erasable (Flash), programmable read-only memory containing 67,108,864 bits organized as 4,194,304 words by 16 bits. Other population densities are contemplated, and the present invention is not limited to the example density. Each memory bank is organized into four independently erasable blocks (16 total). To ensure that critical firmware is protected from accidental erasure or overwrite, the memory can include sixteen 256K-word hardware and software lockable blocks. The memory's four-bank architecture supports true concurrent operations.

A read access to any bank can occur simultaneously with a background WRITE or ERASE operation to any other bank. The synchronous flash memory has a synchronous interface (all signals are registered on the positive edge of the clock signal, CLK). Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

The synchronous flash memory provides for programmable read burst lengths of 1, 2, 4 or 8 locations, or the full page, with a burst terminate option. Further, the synchronous flash memory uses an internal pipelined architecture to achieve high-speed operation.

The synchronous flash memory can operate in low-power memory systems, such as systems operating on three volts. A deep power-down mode is provided, along with a power-saving standby mode. All inputs and outputs are low voltage transistor-transistor logic (LVTTL) compatible. The synchronous flash memory offers substantial advances in Flash operating performance, including the ability to synchronously burst data at a high data rate with automatic column address generation and the capability to randomly change column addresses on each clock cycle during a burst access.

In general, the synchronous flash memory is configured similar to a multi-bank DRAM that operates at low voltage and includes a synchronous interface. Each of the banks is organized into rows and columns. Prior to normal operation, the synchronous flash memory is initialized. The following sections provide detailed information covering device initialization, register definition, command descriptions and device operation.

The synchronous flash is powered up and initialized in a predefined manner. After power is applied to VCC, VCCQ and VCCP (simultaneously), and the clock signal is stable, RP# 140 is brought from a LOW state to a HIGH state. A delay, such as a 100 μs delay, is needed after RP# transitions HIGH in order to complete internal device initialization. After the delay time has passed, the memory is placed in an array read mode and is ready for Mode Register programming or an executable command. After initial programming of a non-volatile mode register 147 (NVMode Register), the contents are automatically loaded into a volatile Mode Register 148 during the initialization. The device will power up in a programmed state and will not require reloading of the non-volatile mode register 147 prior to issuing operational commands. This is explained in greater detail below.

Figures 2, 2A, 2B:
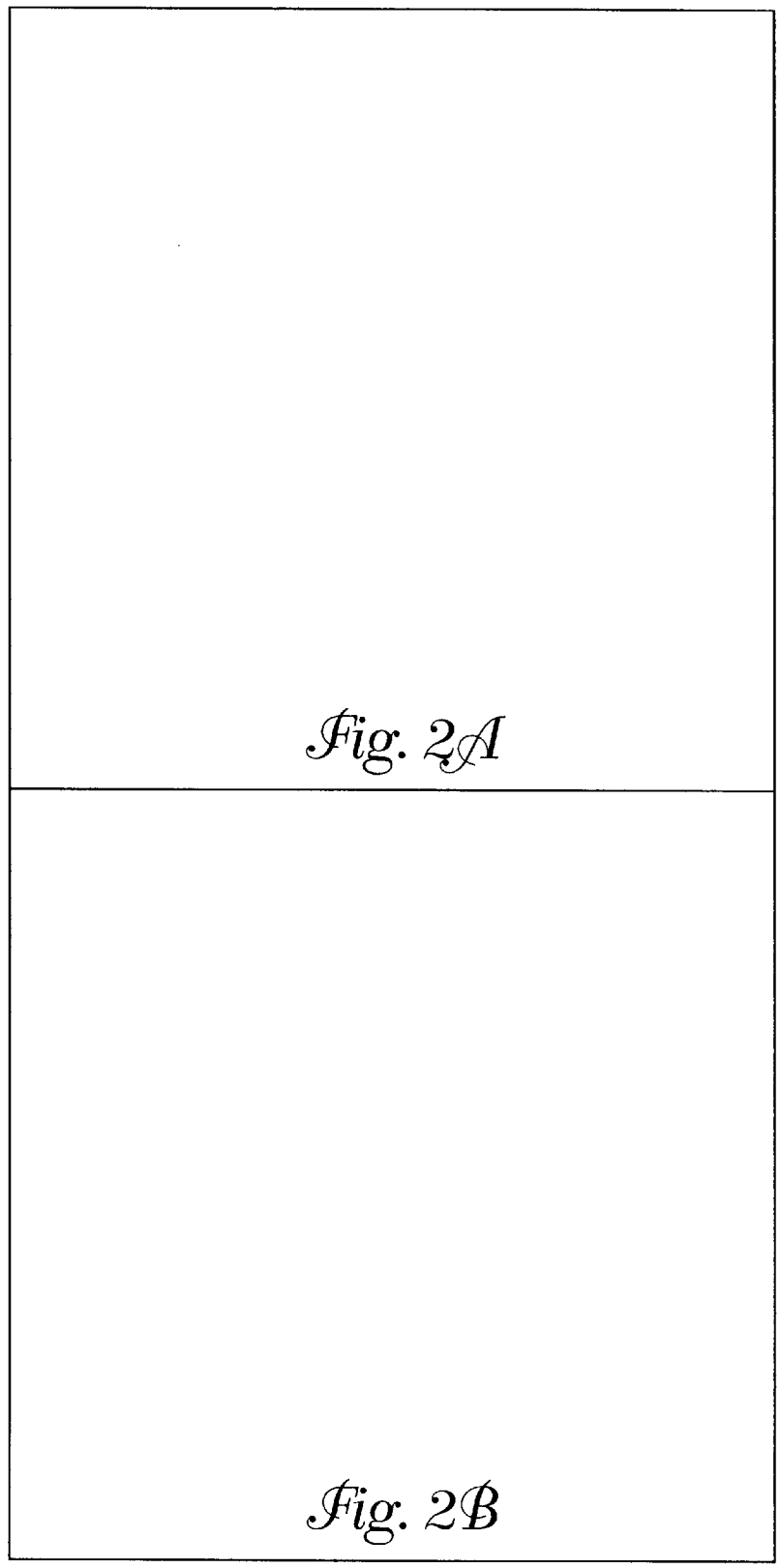
FIG. 2 illustrates a mode register of one embodiment of the present invention.
Figure 2A:
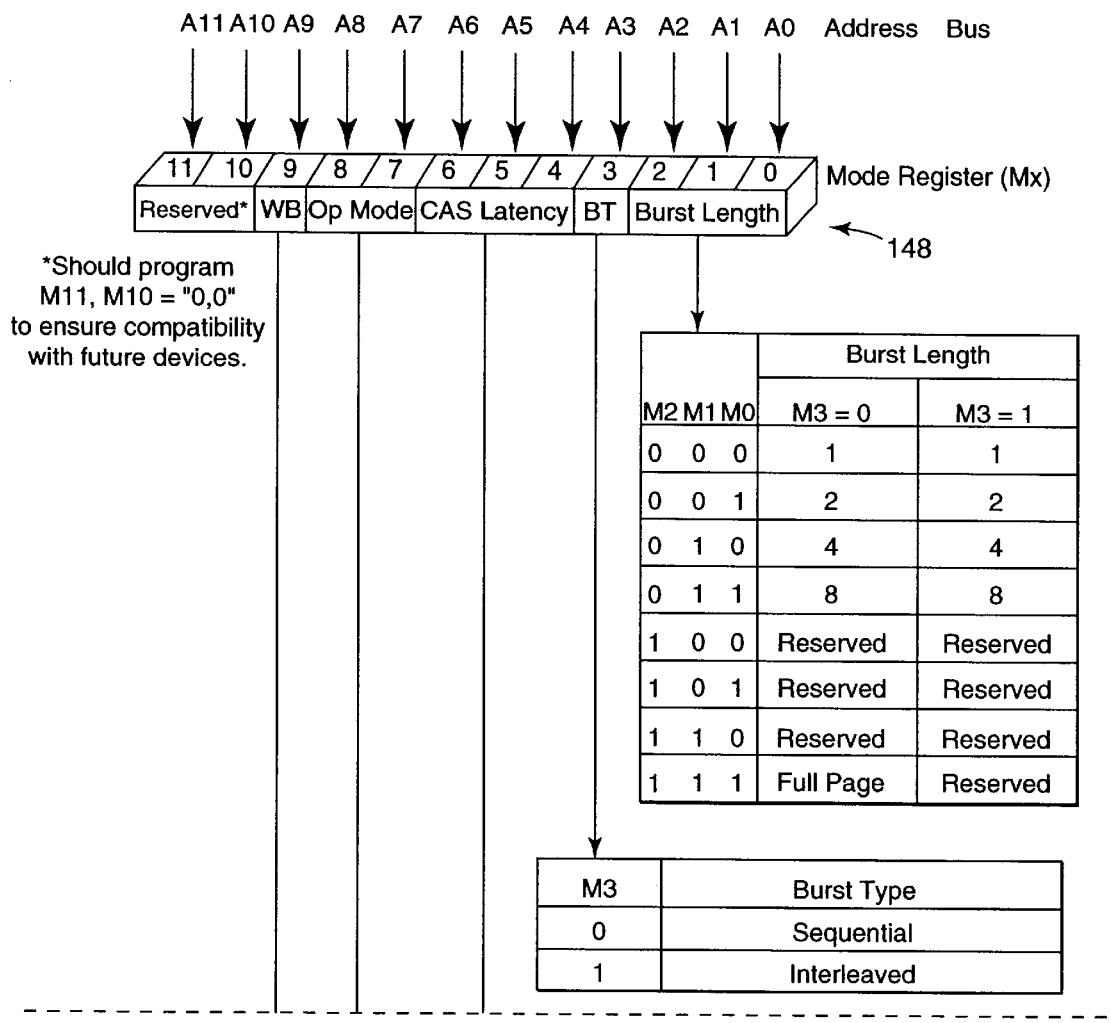
Figure 2B:
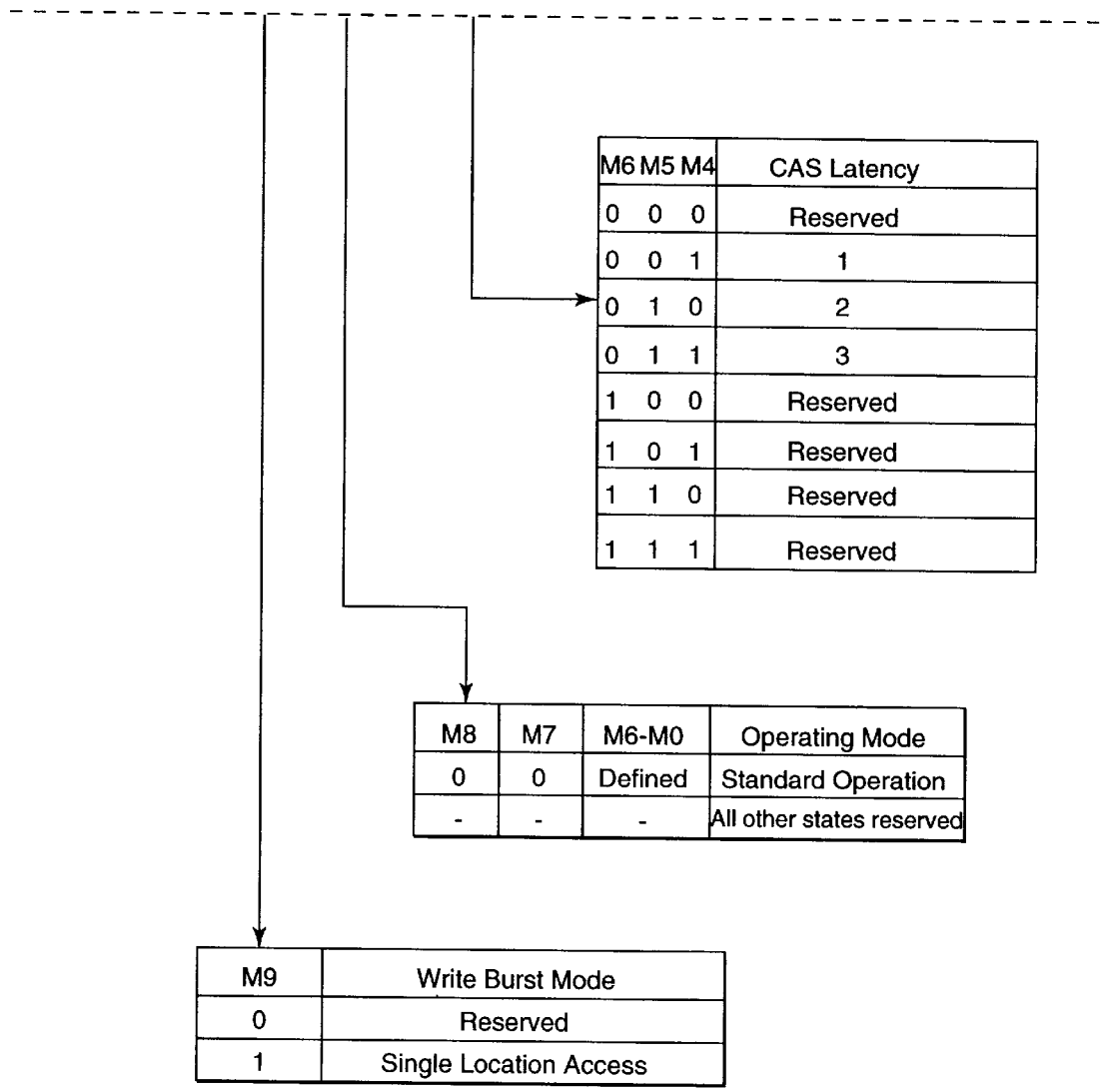

The Mode Register 148 is used to define the specific mode of operation of the synchronous flash memory. This definition includes the selection of a burst length, a burst type, a CAS latency, and an operating mode, as shown in FIG. 2. The Mode Register is programmed via a LOAD MODE REGISTER command and retains stored information until it is reprogrammed. The contents of the Mode Register may be copied into the NVMode Register 147. The NVMode Register settings automatically load the Mode Register 148 during initialization. Details on ERASE NVMODE REGISTER and WRITE NVMODE REGISTER command sequences are provided below. Those skilled in the art will recognize that an SDRAM requires that a mode register must be externally loaded during each initialization operation. The present invention allows a default mode to be stored in the NV mode register 147. The contents of the NV mode register are then copied into a volatile mode register 148 for access during memory operations.

Mode Register bits M0–M2 specify a burst length, M3 specifies a burst type (sequential or interleaved), M4–M6 specify a CAS latency, M7 and M8 specify a operating mode, M9 is set to one, and M10 and M11 are reserved in this embodiment. Because WRITE bursts are not currently implemented, M9 is set to a logic one and write accesses are single location (non-burst) accesses. The Mode Register must be loaded when all banks are idle, and the controller must wait the specified time before initiating a subsequent operation.

Read accesses to the synchronous flash memory can be burst oriented, with the burst length being programmable, as shown in Table 1. The burst length determines the maximum number of column locations that can be automatically accessed for a given READ command. Burst lengths of 1, 2, 4, or 8 locations are available for both sequential and the interleaved burst types, and a full-page burst is available for the sequential type. The full-page burst can be used in conjunction with the BURST TERMINATE command to generate arbitrary burst lengths that is, a burst can be selectively terminated to provide custom length bursts. When a READ command is issued, a block of columns equal to the burst length is effectively selected. All accesses for that burst take place within this block, meaning that the burst will wrap within the block if a boundary is reached. The block is uniquely selected by A1–A7 when the burst length is set to two, by A2–A7 when the burst length is set to four, and by A3–A7 when the burst length is set to eight. The remaining (least significant) address bit(s) are used to select the starting location within the block. Full-page bursts wrap within the page if the boundary is reached.

Accesses within a given burst may be programmed to be either sequential or interleaved; this is referred to as the burst type and is selected via bit M3. The ordering of accesses within a burst is determined by the burst length, the burst type and the starting column address, as shown in Table 1.

TABLE 1

BURST DEFINITION

| Burst Length | Starting Column Address | | | Order of Accesses Within a Burst Type = Sequential | Type = Interleaved |
|---|---|---|---|---|---|
| | | | A0 | 0-1 | 0-1 |
| 2 | | | 0 | 1-0 | 1-0 |
| | | | 1 | | |
| 4 | | A1 | A0 | | |
| | | 0 | 0 | 0-1-2-3 | 0-1-2-3 |
| | | 0 | 1 | 1-2-3-0 | 1-0-3-2 |
| | | 1 | 0 | 2-3-0-1 | 2-3-0-1 |
| | | 1 | 1 | 3-0-1-2 | 3-2-1-0 |
| | A2 | A1 | A0 | | |
| | 0 | 0 | 0 | 0-1-2-3-4-5-6-7 | 0-1-2-3-4-5-6-7 |
| 8 | 0 | 0 | 1 | 1-2-3-4-5-6-7-0 | 1-0-3-2-5-4-7-6 |
| | 0 | 1 | 0 | 2-3-4-5-6-7-0-1 | 2-3-0-1-6-7-4-5 |
| | 0 | 1 | 1 | 3-4-5-6-7-0-1-2 | 3-2-1-0-7-6-5-4 |
| | 1 | 0 | 0 | 4-5-6-7-0-1-2-3 | 4-5-6-7-0-1-2-3 |
| | 1 | 0 | 1 | 5-6-7-0-1-0-3-2 | 5-4-7-6-1-0-3-2 |
| | 1 | 1 | 0 | 6-7-0-1-2-3-4-5 | 6-7-4-5-2-3-0-1 |
| | 1 | 1 | 1 | 7-0-1-2-3-4-5-6 | 7-6-5-4-3-2-1-0 |
| Full Page 256 | n= A0–A7 (location 0–255) | | | Cn, Cn+1, Cn+2 Cn+3, Cn+4 ...Cn−1, Cn... | Not supported |

FUNCTION DESCRIPTION

The synchronous flash memory incorporates a number of features to make it ideally suited for code storage and execute-in-place applications on an SDRAM bus. The memory array is segmented into individual erase blocks. Each block may be erased without affecting data stored in other blocks. These memory blocks are read, written and erased by issuing commands to the command execution logic 130 (CEL). The CEL controls the operaton of the Internal State Machine 132 (ISM), which completely controls all erase non-volatile mode register, write non-volatile mode register, write, block erase, block protect, device protect, unprotect all blocks and verify operations. The ISM 132 protects each memory location from over-erasure and optimizes each memory location for maximum data retention. In addition, the ISM greatly simplifies the control necessary for writing the device in-system or in an external programmer.

The synchronous flash memory is organized into 16 independently erasable memory blocks that allow portions of the memory to be erased without affecting the rest of the memory data. Any block may be hardware-protected against inadvertent erasure or writes. A protected block requires that the RP# pin be driven to VHH (a relatively high voltage) before being modified. The 256K-word blocks at locations 0 and 15 can have additional hardware protection. Once a PROTECT BLOCK command has been executed to these blocks, an UNPROTECT ALL BLOCKS command will unlock all blocks except the blocks at locations 0 and 15, unless the RP# pin is at VHH. This provides additional security for critical code during in-system firmware updates, should an unintentional power disruption or system reset occur.

Power-up initialization, ERASE, WRITE and PROTECT timings are simplified by using an internal state machine (ISM) to control all programming algorithms in the memory array. The ISM ensures protection against over-erasure and optimizes write margin to each cell. During WRITE operations, the ISM automatically increments and monitors WRITE attempts, verifies write margin on each memory cell and updates the ISM Status Register. When a BLOCK ERASE operation is performed, the ISM automatically overwrites the entire addressed block (eliminates over-erasure), increments and monitors ERASE attempts and sets bits in the ISM Status Register.

The 8-bit ISM Status Register 134 allows an external processor 200 to monitor the status of the ISM during WRITE, ERASE and PROTECT operations. One bit of the 8-bit Status Register (SR7) is set and cleared entirely by the ISM. This bit indicates whether the ISM is busy with an ERASE, WRITE or PROTECT task. Additional error information is set in three other bits (SR3, SR4 and SR5): write and protect block error, erase and unprotect all blocks error, and device protection error. Status register bits SR0, SR1 and SR2 provide details on the ISM operation underway. The user can monitor whether a device-level or bank-level ISM operation (including which bank is under ISM control) is underway. These six bits (SR3–SR5) must be cleared by the host system. The Status Register is described in further detail below with reference to Table 2.

The CEL 130 receives and interprets commands to the device. These commands control the operation of the ISM and the read path (i.e., memory array, device configuration or Status Register). Commands may be issued to the CEL while the ISM is active.

To allow for maximum power conservation, the synchronous flash features a very low current, deep power-down mode. To enter this mode, the RP# pin 140 (reset/power-down) is taken to VSS±0.2V. To prevent an inadvertent RESET, RP# must be held at Vss for 100 ns prior to the device entering the reset mode. With RP# held at Vss, the device will enter the deep power-down mode. After the device enters the deep power-down mode, a transition from LOW to HIGH on RP# will result in a device power-up initialize sequence as outlined herein. Transitioning RP# from LOW to HIGH after entering the reset mode but prior to entering deep power-down mode requires a 1 μs delay prior to issuing an executable command. When the device enters the deep power-down mode, all buffers excluding the RP# buffer are disabled and the current draw is low, for example, a maximum of 50 μA at 3.3V VCC. The input to RP# must remain at Vss during deep power-down. Entering the RESET mode clears the Status Register 134 and sets the ISM 132 to the array read mode.

The synchronous flash memory array architecture is designed to allow sectors to be erased without disturbing the rest of the array. The array is divided into 16 addressable "blocks" that are independently erasable. By erasing blocks rather than the entire array, the total device endurance is enhanced, as is system flexibility. Only the ERASE and BLOCK PROTECT functions are block oriented. The 16 addressable blocks are equally divided into four banks 104, 106, 108 and 110 of four blocks each. The four banks have simultaneous read-while-write functionality. An ISM WRITE or ERASE operation to any bank can occur simultaneously to a READ operation to any other bank. The Status Register 134 may be polled to determine which bank is under ISM operation. When status register bit 7 (SR7)=1, the ISM operation will be complete and a subsequent ISM operation may be initiated.

Any block may be hardware-protected to provide extra security for the most sensitive portions of the firmware. During a WRITE or ERASE of a hardware protected block, the RP# pin must be held at VHH until the WRITE or ERASE is completed. Any WRITE or ERASE attempt on a protected block without RP#=VHH will be prevented and will result in a write or erase error. The blocks at locations 0 and 15 can have additional hardware protection to prevent an inadvertent WRITE or ERASE operation. In this embodiment, these blocks cannot be software-unlocked through an UNPROTECT ALL BLOCKS command unless RP#=VHH. The protection status of any block may be checked by reading its block protect bit with a READ STATUS REGISTER command. Further, to protect a block, a three-cycle command sequence must be issued with the block address.

The synchronous flash memory can feature three different types of READs. Depending on the mode, a READ operation will produce data from the memory array, status register, or one of the device configuration registers. A READ command to any bank outputs the contents of the memory array. A READ to any location in the bank under ISM control may output invalid data if a WRITE or ERASE ISM operation is taking place.

Performing a READ of the Status Register 134 requires the same input sequencing as when reading the array, except that a read status register command (70H) cycle must precede ACTIVE READ cycles. The burst length of the Status Register data-out is defined by the Mode Register 148. The Status Register contents are updated and latched on the next positive clock edge subject to CAS latencies.

The 8-bit ISM Status Register 134 (see Table 2) is polled to check for ERASE NVMODE REGISTER, WRITE NVMODE REGISTER, WRITE, ERASE, BLOCK PROTECT, DEVICE PROTECT or UNPROTECT ALL BLOCKS completion or any related errors. Completion of an ISM operation can be monitored by issuing a READ STATUS REGISTER (70nH) command. The contents of the Status Register will be output to DQ0–DQ7 and updated on the next positive clock edge (subject to CAS latencies) for a fixed burst length as defined by the mode register settings. The ISM operation will be complete when SR7=1. All of the defined bits are set by the ISM, but only the ISM status bit is reset by the ISM. The erase/unprotect block, write/protect block, device protection must be cleared using a CLEAR STATUS REGISTER (50H) command. This allows the user to choose when to poll and clear the Status Register. For example, a host system may perform multiple WRITE operations before checking the Status Register instead of checking after each individual WRITE. Asserting the RP# signal or powering down the device will also clear the Status Register.

TABLE 2

STATUS REGISTER

| STATUS BIT# | STATUS REGISTER BIT | DESCRIPTION |
| --- | --- | --- |
| SR7 | ISM STATUS<br>1 = Ready<br>0 = Busy | The ISMS bit displays the active status of the state machine when performing WRITE or BLOCK ERASE. The controlling logic polls this bit to determine when the erase and write status bits are valid. |
| SR6 | RESERVED | |
| SR5 | ERASE/UNPROTECT BLOCK STATUS<br>1 = BLOCK ERASE or BLOCK UNPROTECT error<br>0 = Successful BLOCK ERASE or UNPROTECT | ES is set to 1 after the maximum number of ERASE cycles is executed by the ISM without a successful verify. This bit is also set to 1 if a BLOCK UNPROTECT operation is unsuccessful. ES is only cleared by a CLEAR STATUS REGISTER command or by a RESET. |
| SR4 | WRITE/PROTECT BLOCK STATUS<br>1 = WRITE or BLOCK PROTECT error<br>0 = Successful WRITE or BLOCK PROTECT | WS is set to 1 after the maximum number of WRITE cycles is executed by the ISM without a successful verify. This bit is also set to 1 if a BLOCK or DEVICE PROTECT operation is unsuccessful. WS is only cleared by a CLEAR STATUS REGISTER command or by a RESET. |

TABLE 2-continued

STATUS REGISTER

| STATUS BIT# | STATUS REGISTER BIT | DESCRIPTION |
|---|---|---|
| SR2 | BANKA1 ISM STATUS | When SR0 = 0, the bank under ISM control can be decoded from BA0, BA1: [0,0] Bank0; [0,1] Bank1; [1,0] Bank2; [1,1] Bank3. |
| SR1 | BANKA0 ISM STATUS | |
| SR3 | DEVICE PROTECT STATUS<br>1 = Device protected, invalid operation attempted<br>0 = Device unprotected or RP# condition met | DPS is set to 1 if an invalid WRITE, ERASE, PROTECT BLOCK, PROTECT DEVICE or UNPROTECT ALL BLOCKS is attempted. After one of these commands is issued, the condition of RP#, the block protect bit and the device protect bit are compared to determine if the desired operation is allowed. Must be cleared by CLEAR STATUS REGISTER or by a RESET. |
| SR0 | DEVICE/BANK ISM STATUS<br>1 = Device level ISM operation<br>0 = Bank level ISM operation | DBS is set to 1 if the ISM operation is a device-level operation. A valid READ to any bank of the array can immediately follow the registration of a device-level ISM WRITE operation. When DBS is set to 0, the ISM operation is a bank-level operation. A READ to the bank under ISM control may result in invalid data. SR2 and SR3 can be decoded to determine which bank is under ISM control. |

Upon power-up and prior to issuing any operational commands to the device, the synchronous flash is initialized. After power is applied to VCC, VCCQ and VCCP (simultaneously), and the clock is stable, RP# is transitioned from LOW to HIGH. A delay (in one embodiment a 100 µs delay) is required after RP# transitions HIGH in order to complete internal device initialization. The device is in the array read mode at the completion of device initialization, and an executable command can be issued to the device.

While the state machine (ISM) executes a WRITE, the ISM status register bit (SR7) will be at 0. A READ operation to the bank under ISM control may produce invalid data. When the ISM status bit (SR7) is set to a logic 1, the WRITE has been completed, and the bank will be in the array read mode and ready for an executable command. Writing to hardware-protected blocks also requires that the RP# pin be set to VHH prior to the third cycle (WRITE), and RP# must be held at VHH until the ISM WRITE operation is complete. The write and erase status bits (SR4 and SR5) will be set if a proper command sequence is not completed on consecutive cycles or the bank address changes for any of the three cycles. After the ISM has initiated the WRITE, it cannot be aborted except by a RESET or by powering down the part. Doing either during a WRITE may corrupt the data being written.

After the ISM status bit (SR7) has been set, the device/bank (SR0), device protect (SR3), bankA0 (SR1), bankA1 (SR2), write/protect block (SR4) and erase/unprotect (SR5) status bits may be checked. If one or a combination of SR3, SR4, SR5 status bits has been set, an error has occurred during operation. The ISM cannot reset the SR3, SR4 or SR5 bits. To clear these bits, a CLEAR STATUS REGISTER (50H) command must be given. Table 3 lists the combinations of errors.

TABLE 3

STATUS REGISTER ERROR DECODE

| STATUS BITS | | | |
|---|---|---|---|
| SR5 | SR4 | SR3 | ERROR DESCRIPTION |
| 0 | 0 | 0 | No errors |
| 0 | 1 | 0 | WRITE, BLOCK PROTECT or DEVICE PROTECT error |
| 0 | 1 | 1 | Invalid BLOCK PROTECT or DEVICE PROTECT, RP# not valid (V$_{HH}$) |
| 0 | 1 | 1 | Invalid BLOCK or DEVICE PROTECT, RP# not valid |
| 1 | 0 | 0 | ERASE or ALL BLOCK UNPROTECT error |
| 1 | 0 | 1 | Invalid ALL BLOCK UNPROTECT, RP# not valid (V$_{HH}$) |
| 1 | 1 | 0 | Command sequencing error |

Figure 3:
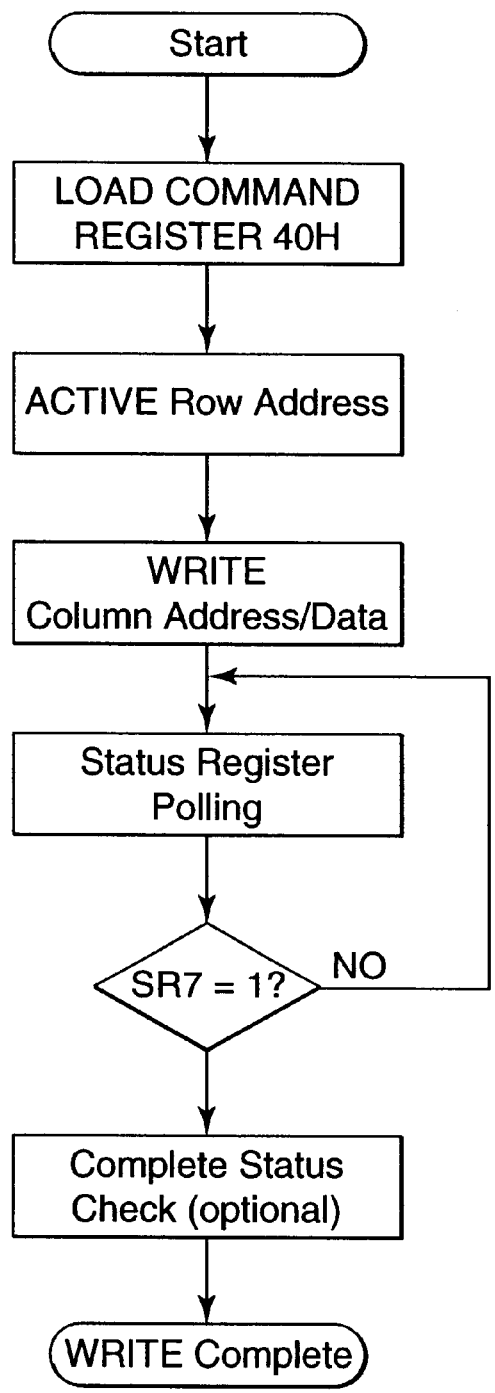
FIG. 3 is a flow chart of a self-timed write sequence according to one embodiment of the present invention.

Referring to FIG. 3, a flow chart of a self-timed write sequence according to one embodiment of the present invention is described. The sequence includes loading the command register (code 40H), receiving an active command and a row address, and receiving a write command and a column address. The sequence then provides for a status register polling to determine if the write is complete. The polling monitors status register bit 7 (SR7) to determine if it is set to a 1. An optional status check can be included. When the write is completed, the array is placed in the array read mode.

Figure 4:
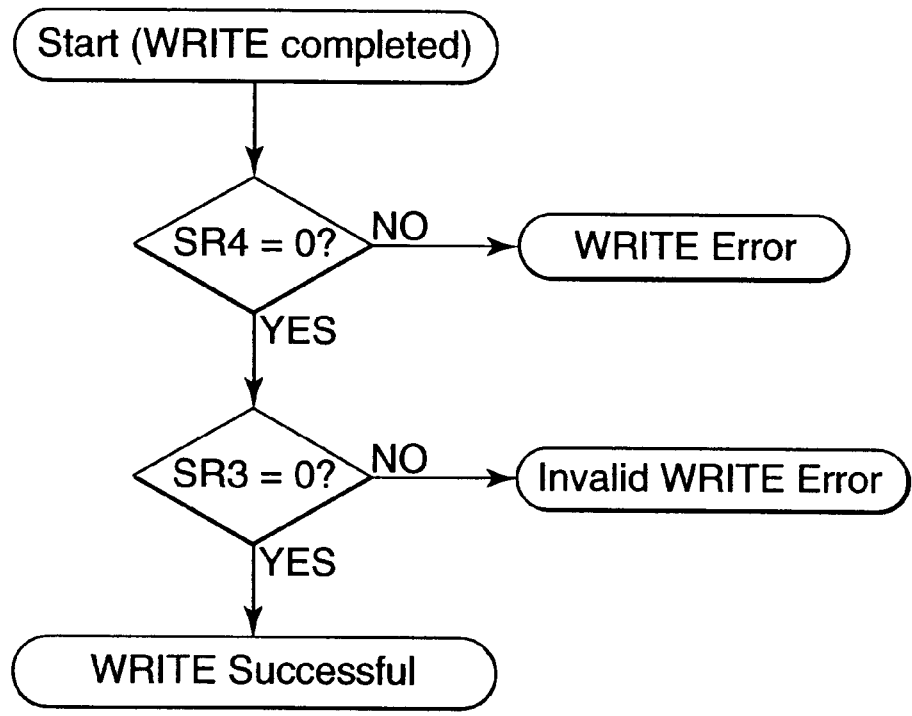
FIG. 4 is a flow chart of a complete write status-check sequence according to one embodiment of the present invention.

Referring to FIG. 4, a flow chart of a complete write status-check sequence according to one embodiment of the present invention is provided. The sequence looks for status register bit 4 (SR4) to determine if it is set to a 0. If SR4 is a 1, there was an error in the write operation. The sequence also looks for status register bit 3 (SR3) to determine if it is set to a 0. If SR3 is a 1, there was an invalid write error during the write operation.

Figure 5:
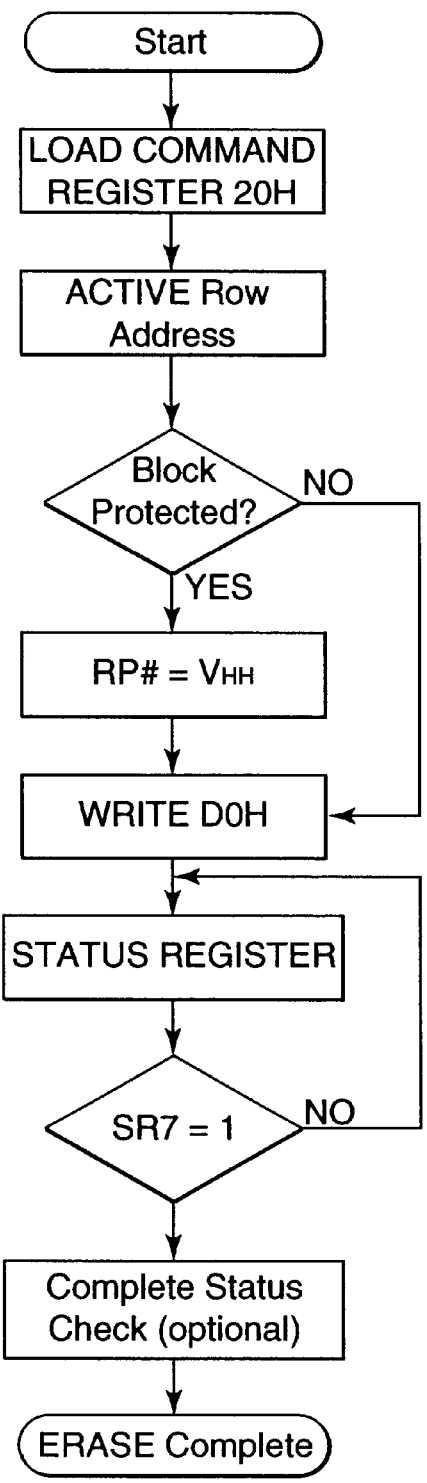
FIG. 5 is a flow chart of a self-timed block erase sequence according to one embodiment of the present invention.

Referring to FIG. 5, a flow chart of a self-timed block erase sequence according to one embodiment of the present invention is provided. The sequence includes loading the command register (code 20H), and receiving an active command and a row address. The memory then determines if the block is protected. If it is not protected, the memory performs a write operation (D0H) to the block and monitors the status register for completion. An optional status check can be performed and the memory is placed in an array read mode. If the block is protected, the erase is not allowed unless the RP# signal is at an elevated voltage (VHH).

Figure 6:
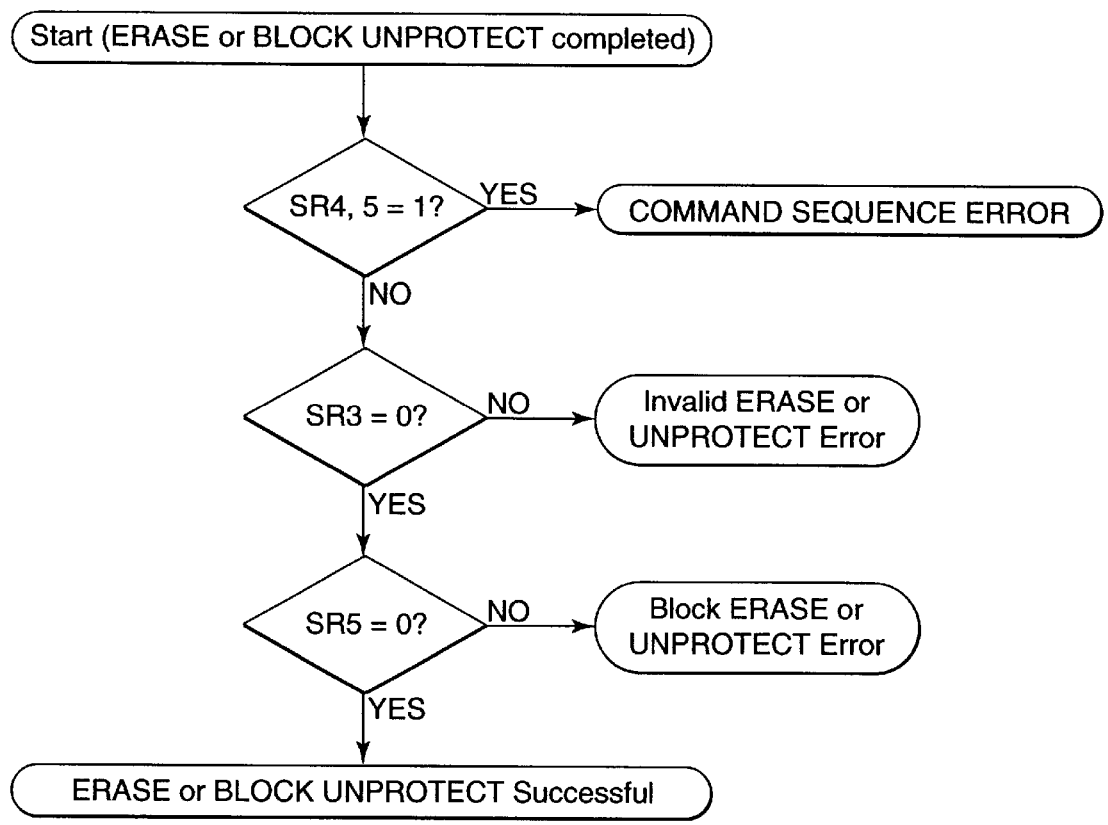
FIG. 6 is a flow chart of a complete block erase status-check sequence according to one embodiment of the present invention.

FIG. 6 illustrates a flow chart of a complete block erase status-check sequence according to one embodiment of the present invention. The sequence monitors the status register to determine if a command sequence error occurred (SR4 or SR5=1). If SR3 is set to a 1, an invalid erase or unprotect error occurred. Finally, a block erase or unprotect error happened if SR5 is set to a 1.

Figure 7:
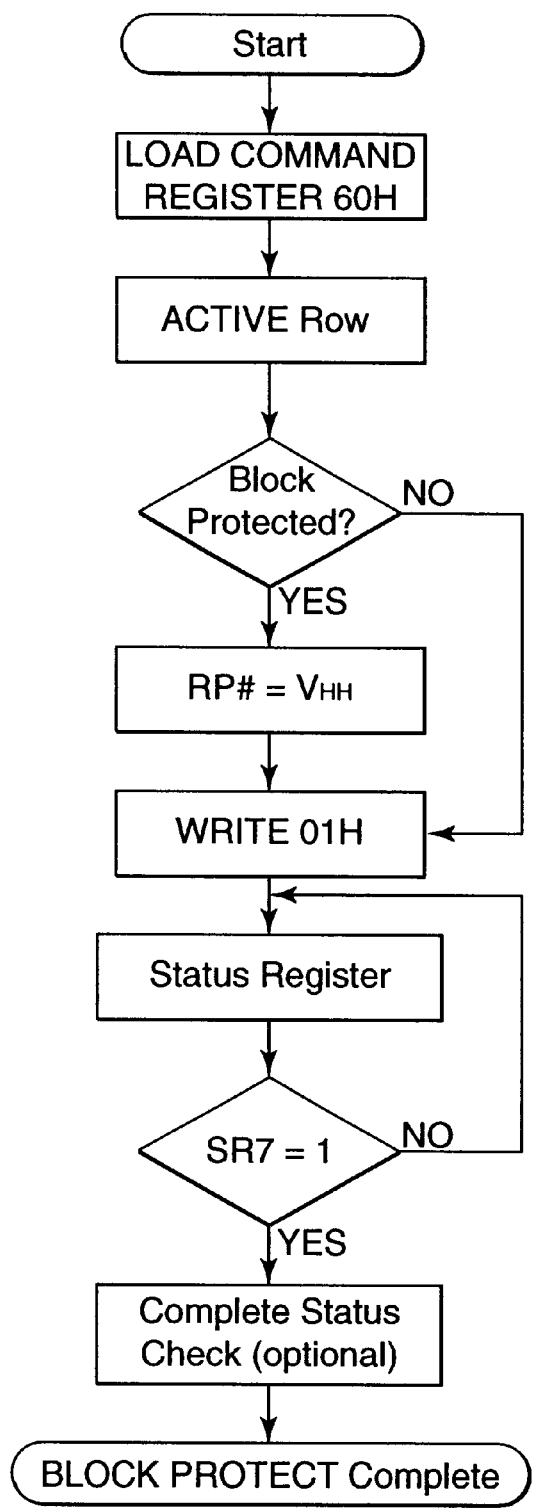
FIG. 7 is a flow chart of a block protect sequence according to one embodiment of the present invention.

FIG. 7 is a flow chart of a block protect sequence according to one embodiment of the present invention. The sequence includes loading the command register (code 60H), and receiving an active command and a row address. The memory then determines if the block is protected. If it is not protected, the memory performs a write operation (01H) to the block and monitors the status register for completion. An optional status check can be performed and the memory is placed in an array read mode. If the block is protected, the erase is not allowed unless the RP# signal is at an elevated voltage (VHH).

Figure 8:
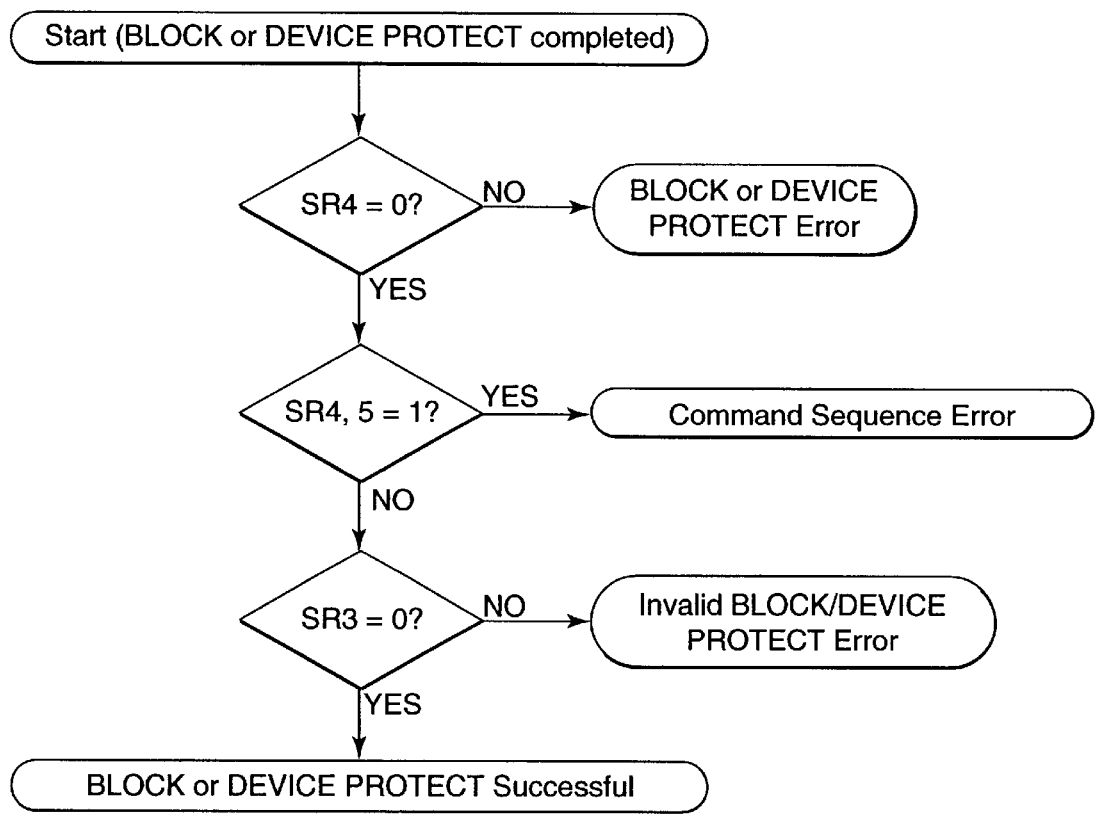
FIG. 8 is a flow chart of a complete block status-check sequence according to one embodiment of the present invention.

Referring to FIG. 8, a flow chart of a complete block status-check sequence according to one embodiment of the present invention is provided. The sequence monitors the status register bits 3, 4 and 5 to determine of errors were detected.

Figure 9:
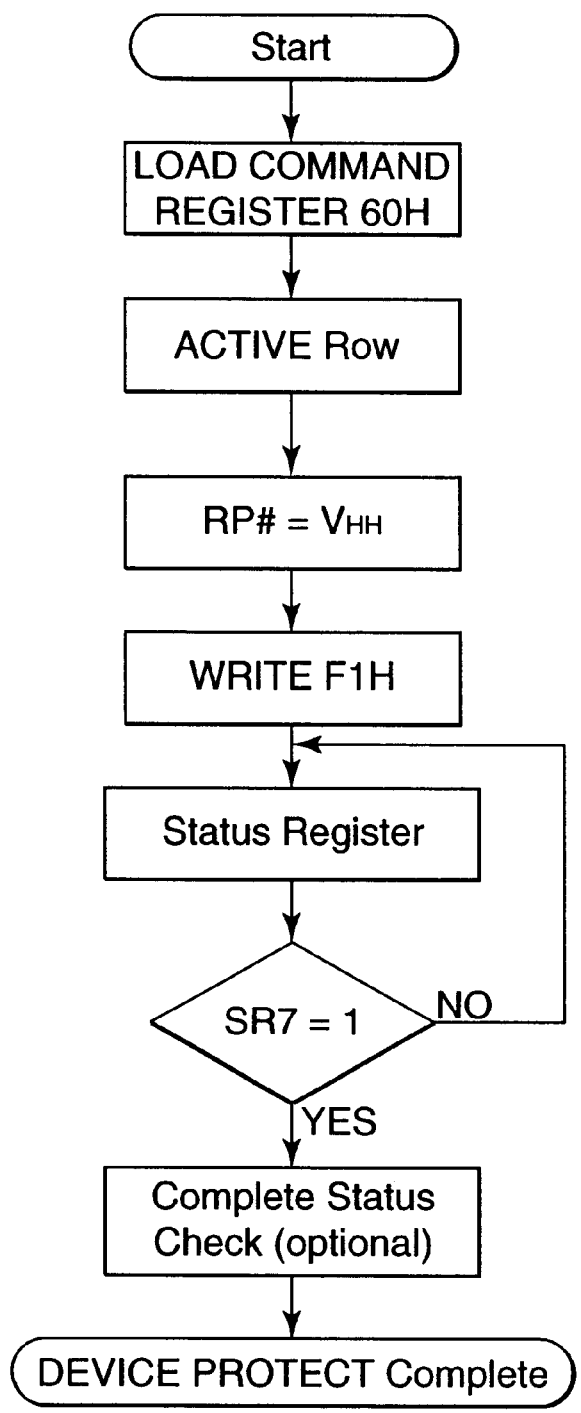
FIG. 9 is a flow chart of a device protect sequence according to one embodiment of the present invention.

FIG. 9 is a flow chart of a device protect sequence according to one embodiment of the present invention. The sequence includes loading the command register (code 60H), and receiving an active command and a row address. The memory then determines if RP# is at VHH. The memory performs a write operation (F1H) and monitors the status register for completion. An optional status check can be performed and the memory is placed in an array read mode.

Figure 10:
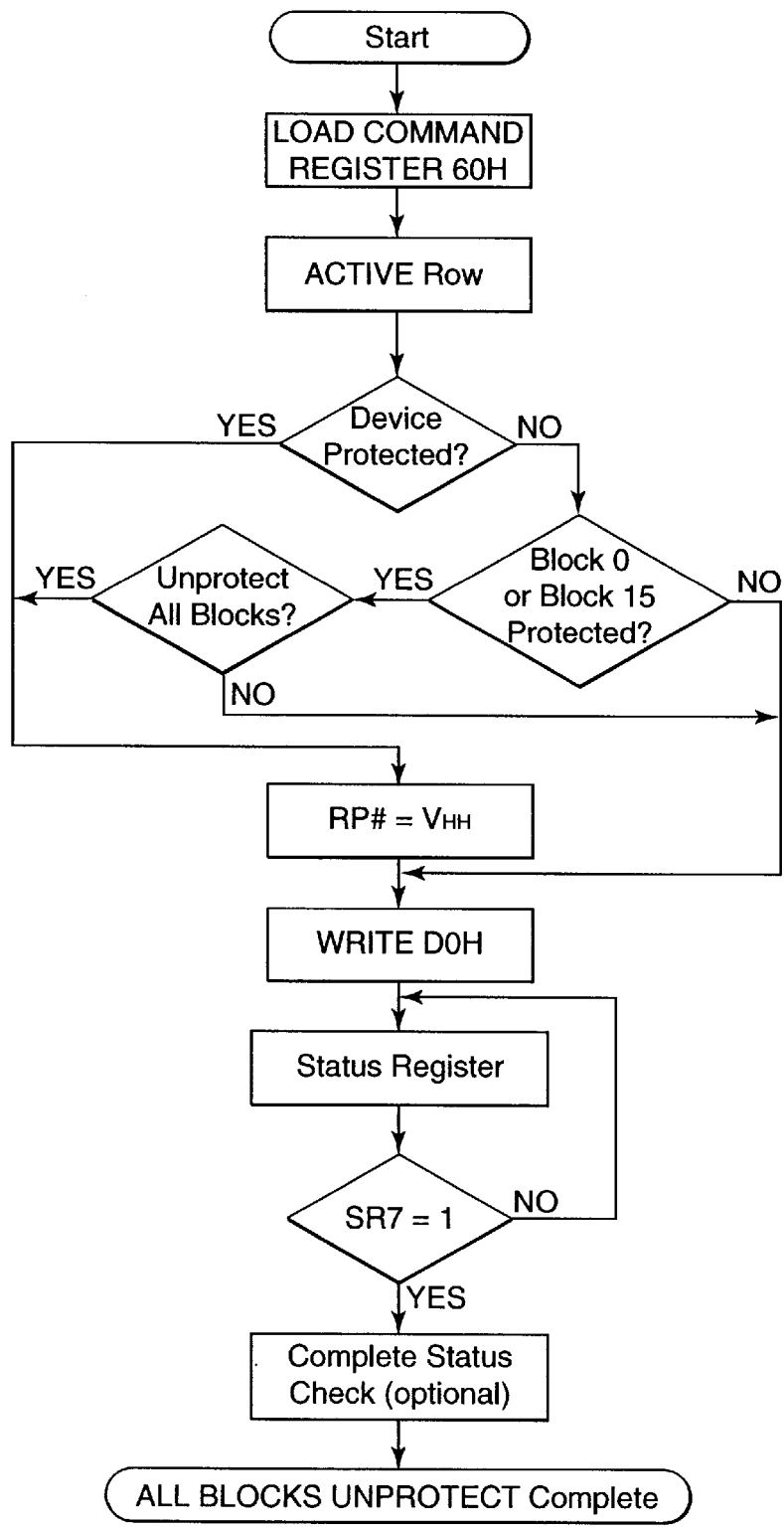
FIG. 10 is a flow chart of a block unprotect sequence according to one embodiment of the present invention.

FIG. 10 is a flow chart of a block unprotect sequence according to one embodiment of the present invention. The sequence includes loading the command register (code 60H), and receiving an active command and a row address. The memory then determines if the memory device is protected. If it is not protected, the memory determines if the boot locations (blocks 0 and 15) are protected. If none of the blocks are protected the memory performs a write operation (D0H) to the block and monitors the status register for completion. An optional status check can be performed and the memory is placed in an array read mode. If the device is protected, the erase is not allowed unless the RP# signal is at an elevated voltage (VHH). Likewise, if the boot locations are protected, the memory determines if all blocks should be unprotected.

Figure 11:
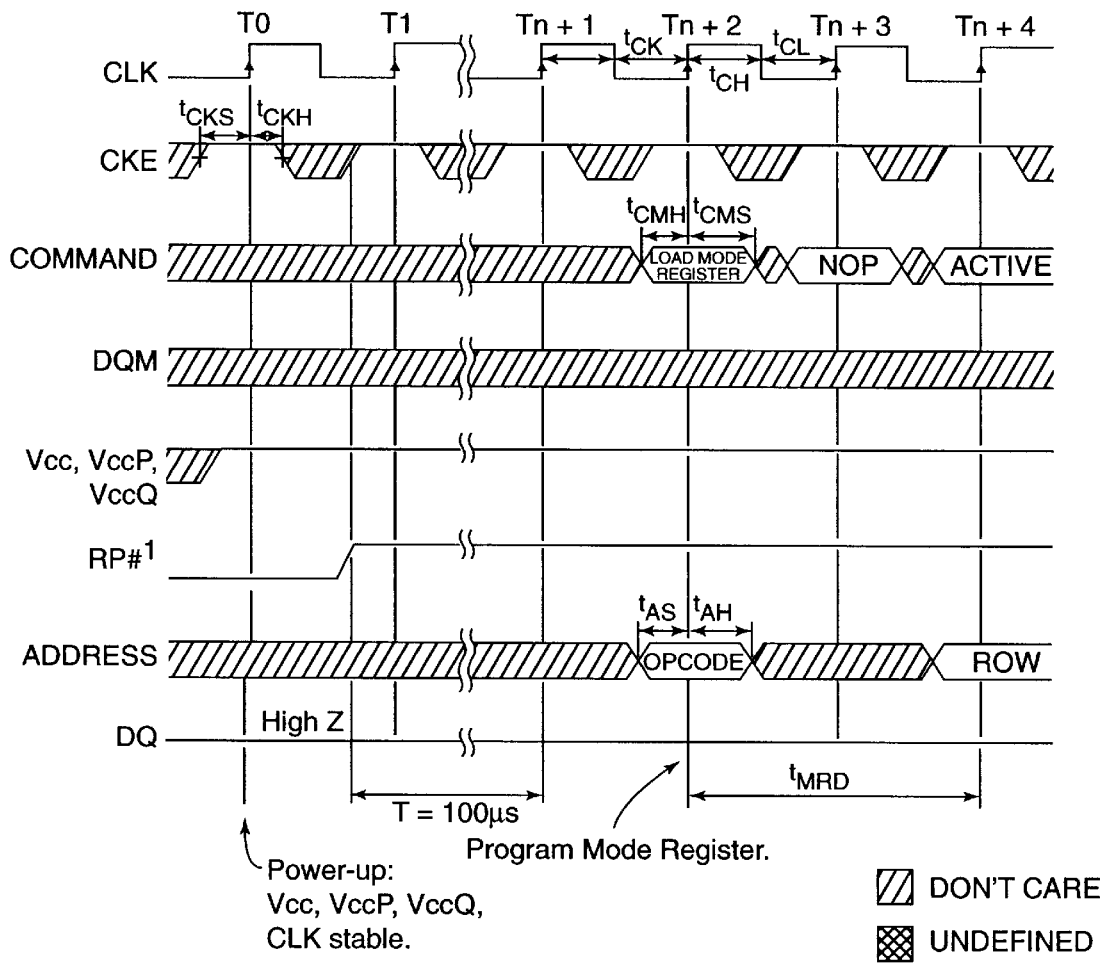
FIG. 11 illustrates the timing of an initialize and load mode register operation.

FIG. 11 illustrates the timing of an initialize and load mode register operation. The mode register is programmed by providing a load mode register command and providing operation code (opcode) on the address lines. The opcode is loaded into the mode register. As explained above, the contents of the non-volatile mode register are automatically loaded into the mode register upon power-up and the load mode register operation may not be needed.

Figure 12:
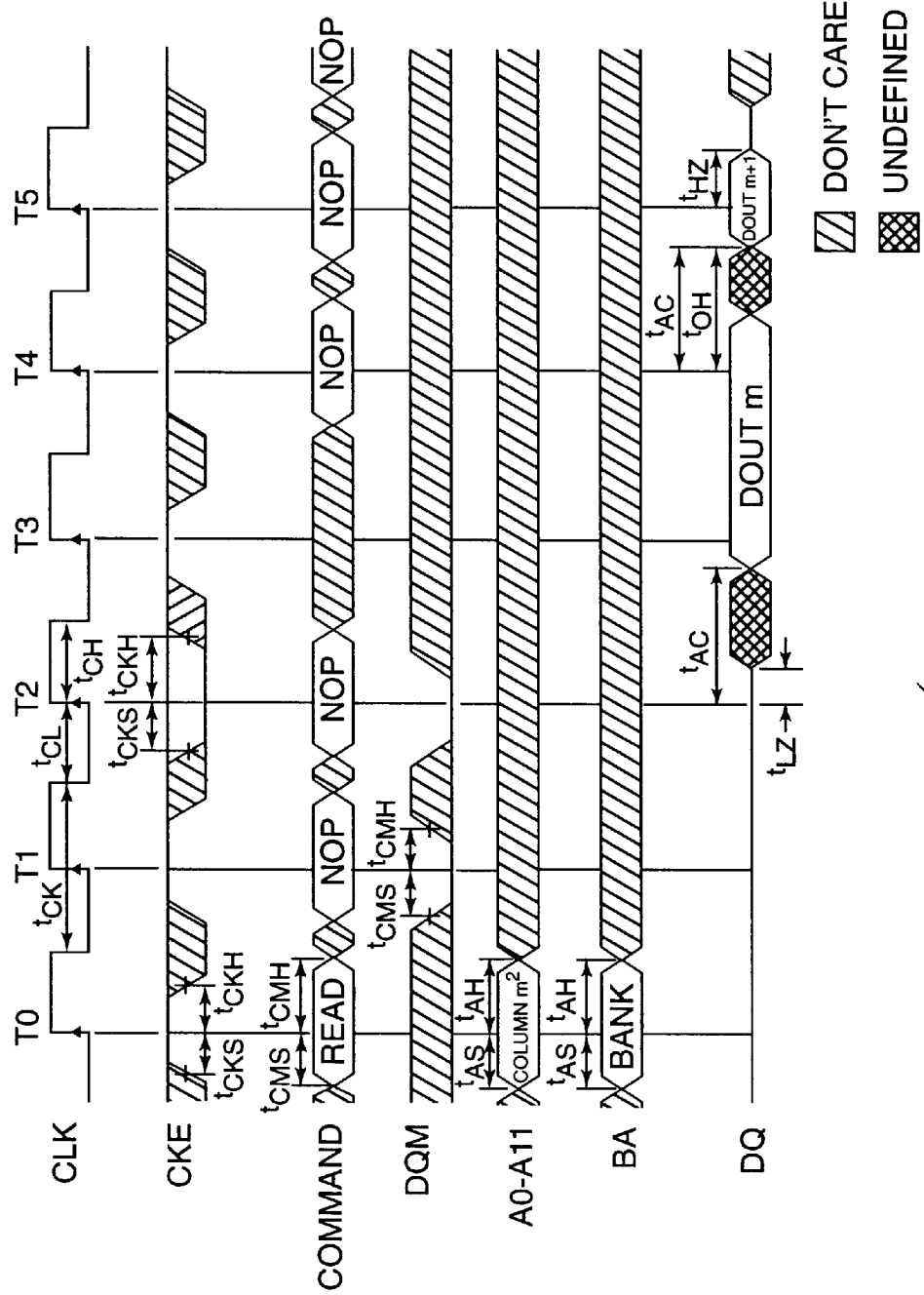
FIG. 12 illustrates the timing of a clock suspend mode operation.
Figure 13:
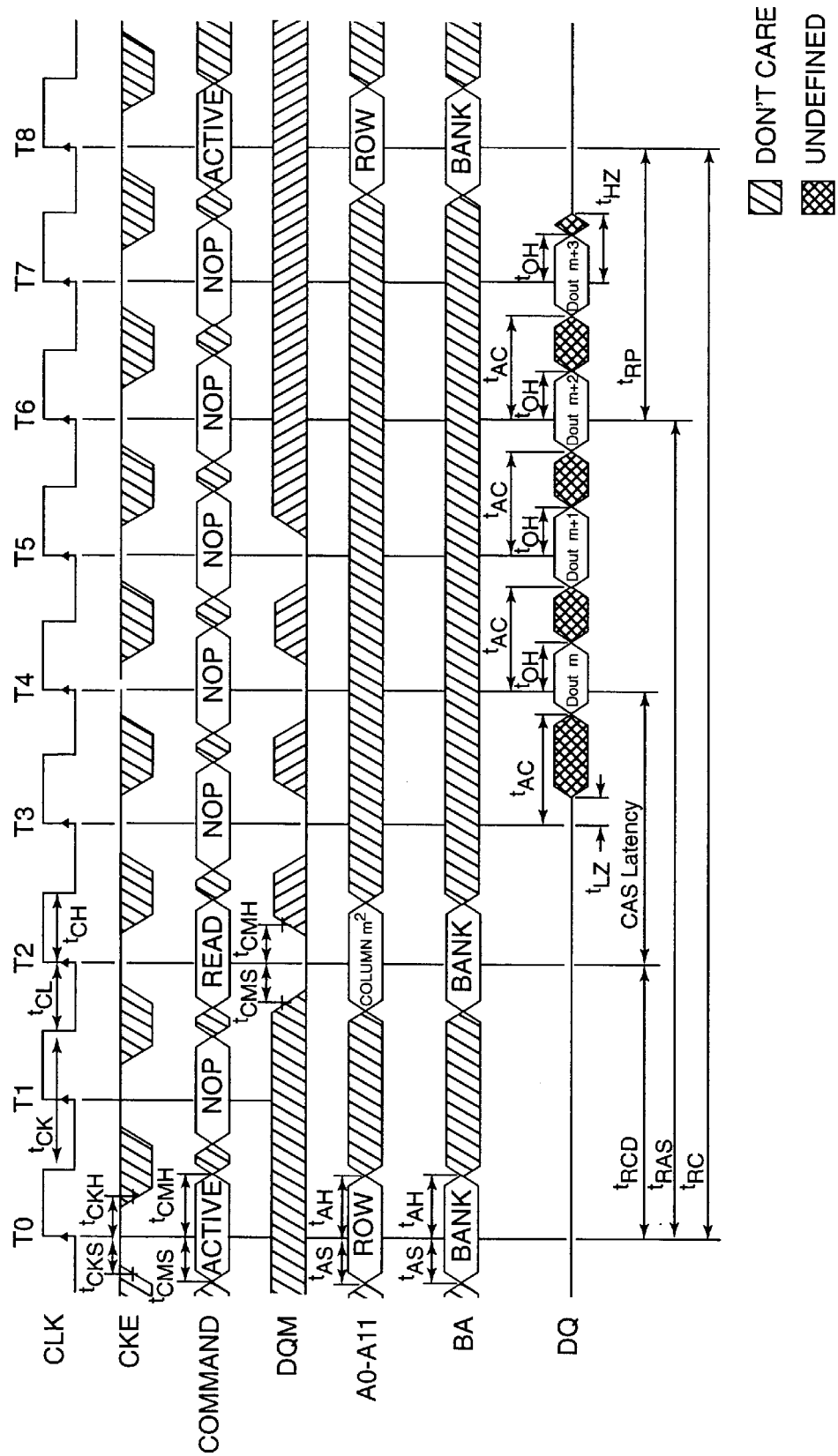
FIG. 13 illustrates the timing of a burst read operation.
Figure 14:
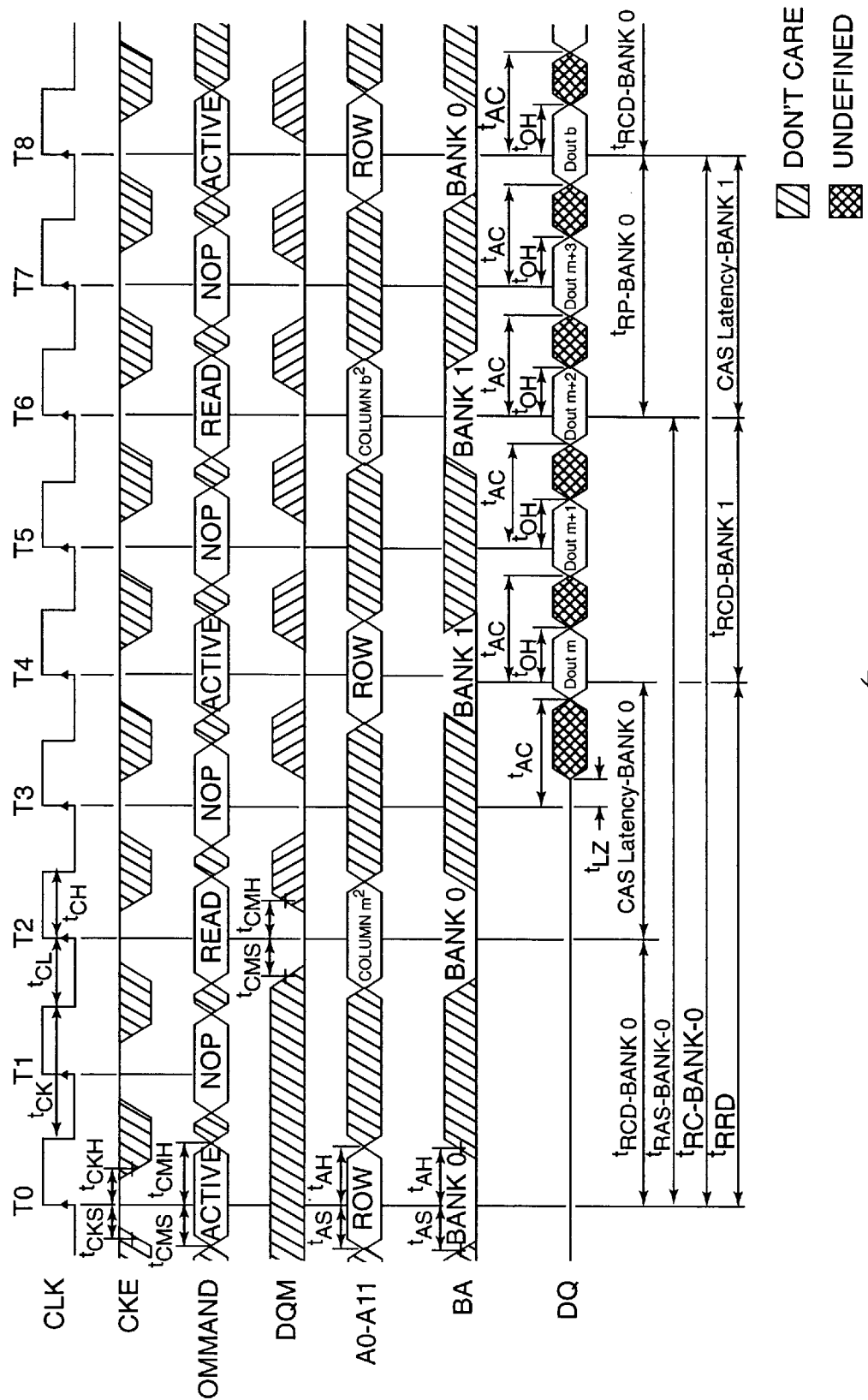
FIG. 14 illustrates the timing of alternating bank read accesses.
Figure 15:
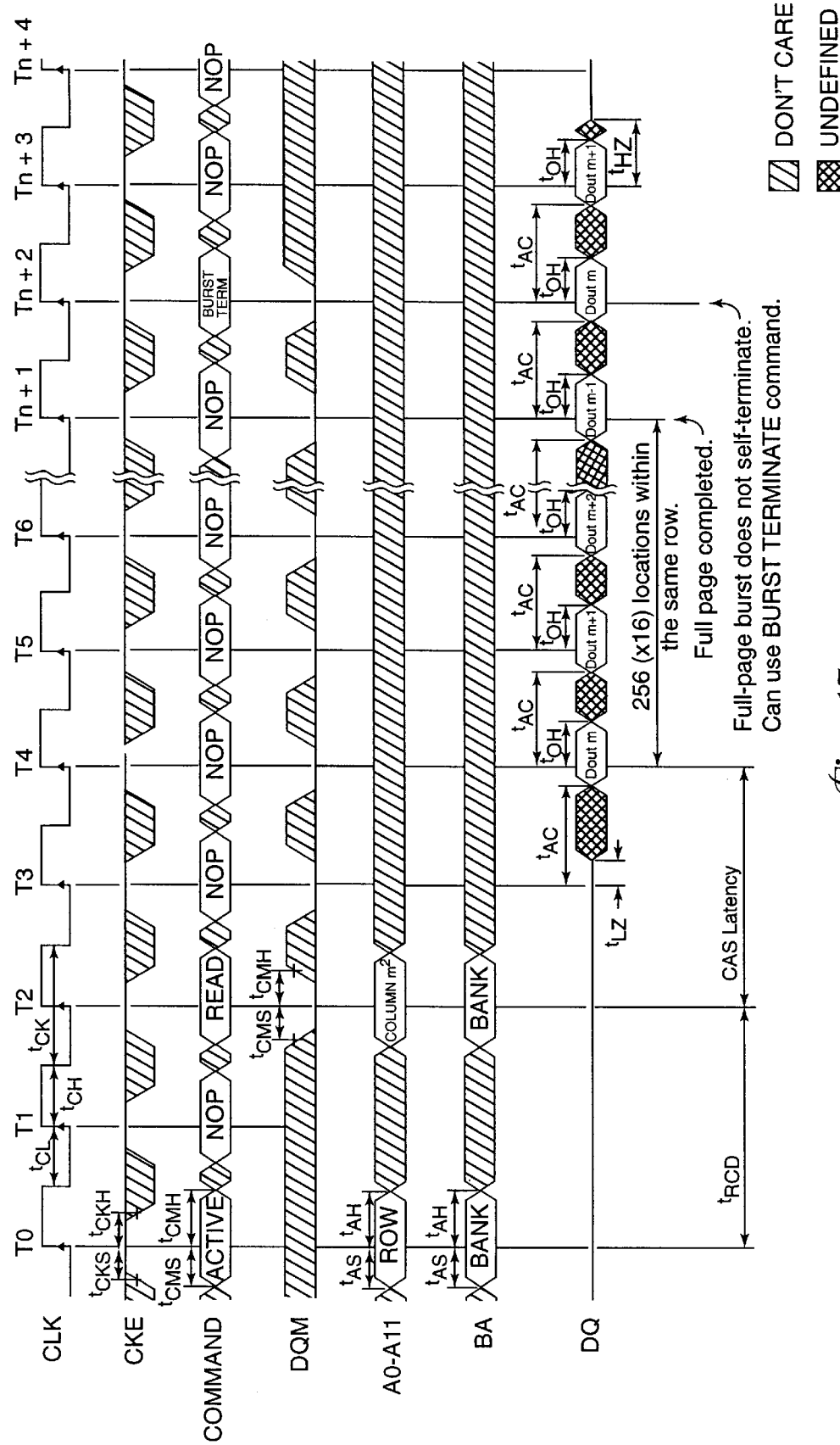
FIG. 15 illustrates the timing of a full-page burst read operation.

FIG. 12 illustrates the timing of a clock suspend mode operation, and FIG. 13 illustrates the timing of another burst read operation. FIG. 14 illustrates the timing of alternating bank read accesses. Here active commands are needed to change bank addresses. A full page burst read operation is illustrated in FIG. 15. Note that the full page burst does not self terminate, but requires a terminate command.

Figure 16:
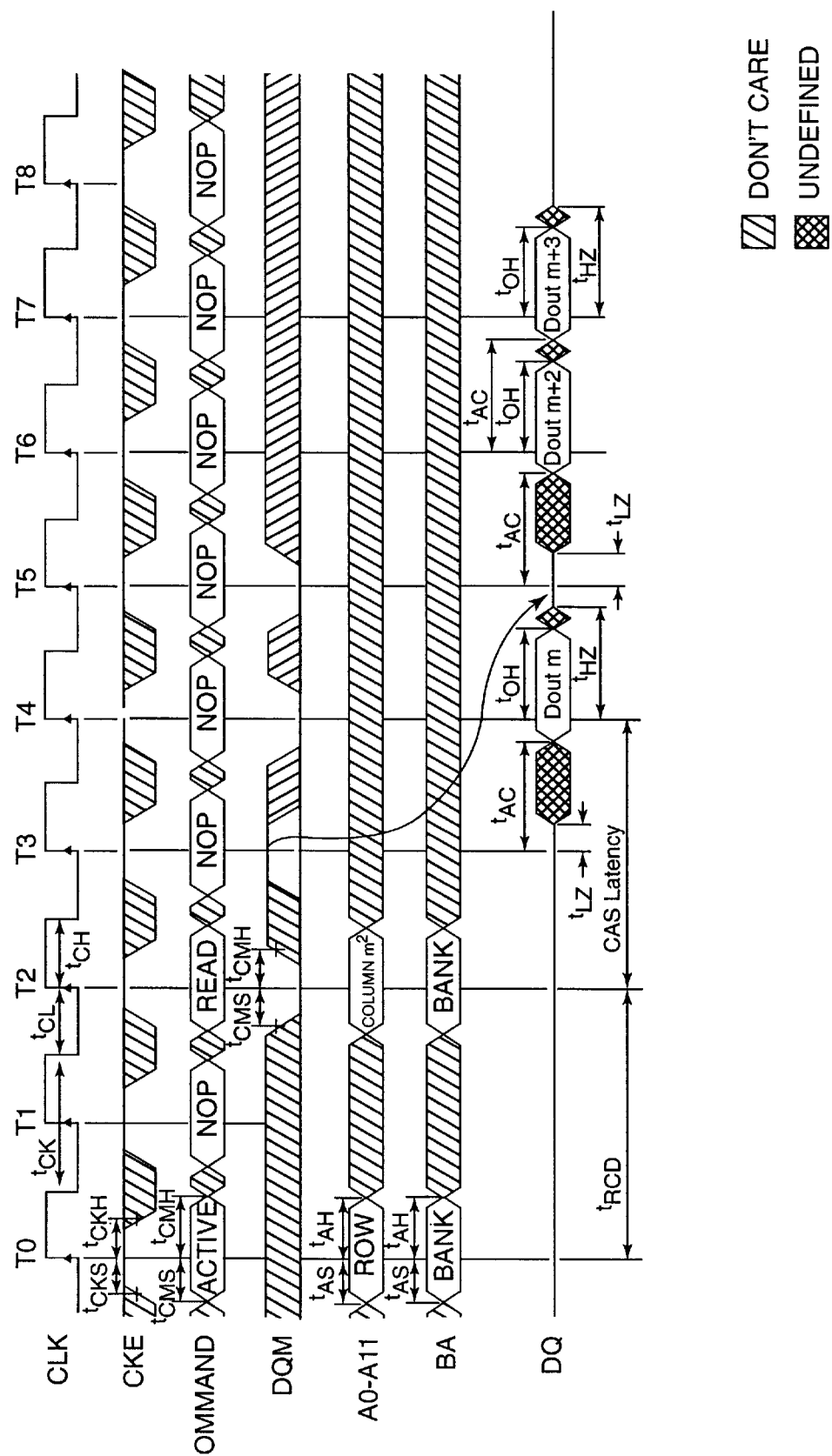
FIG. 16 illustrates the timing of a burst read operation using a data mask signal.

FIG. 16 illustrates the timing of a read operation using a data mask signal. The DQM signal is used to mask the data output so that Dout m+1 is not provided on the DQ connections.

Figure 17:
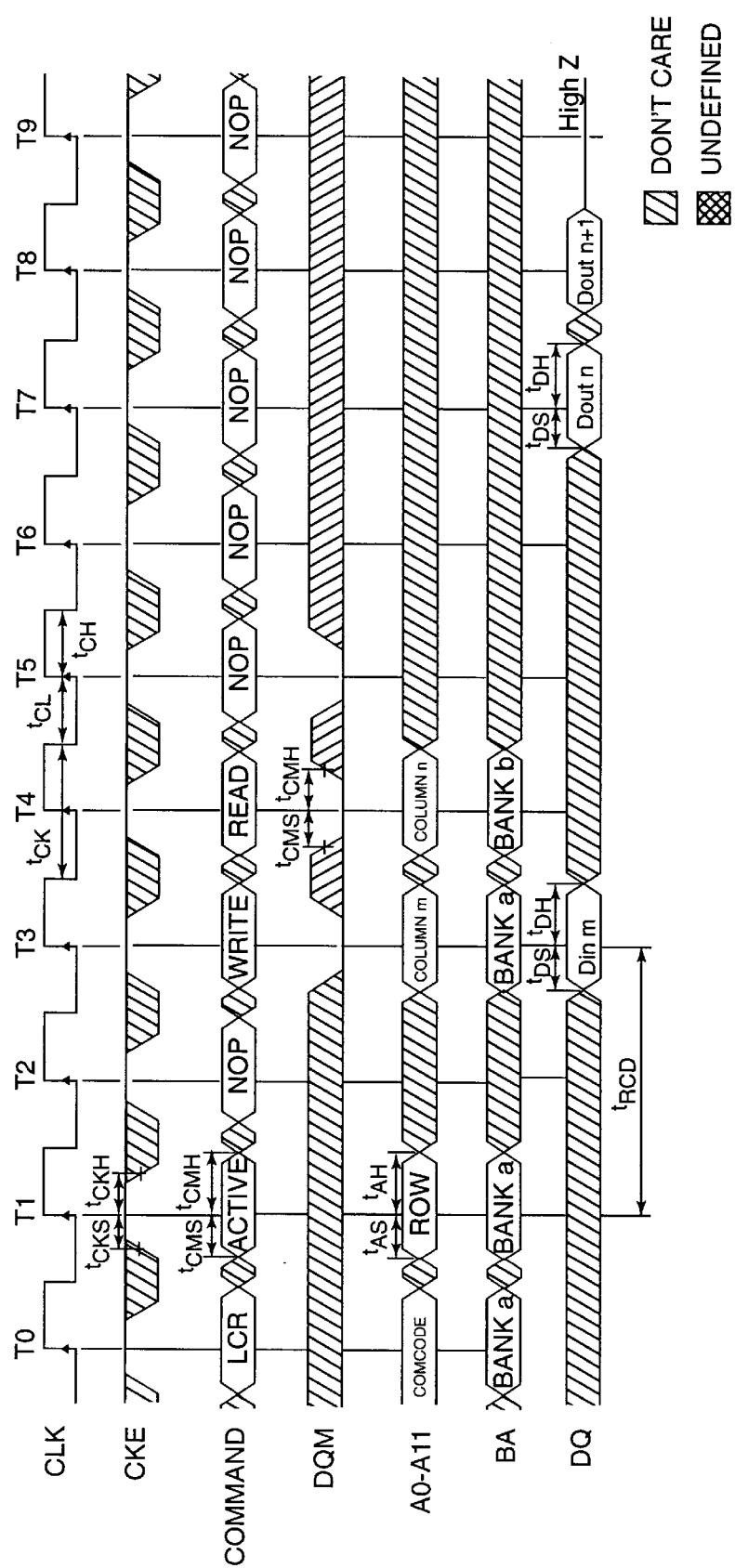
FIG. 17 illustrates the timing of a write operation followed by a read to a different bank.

Referring to FIG. 17, the timing of a write operation followed by a read to a different bank is illustrated. In this operation, a write is performed to bank A and a subsequent read is performed to bank B. The same row is accessed in each bank.

Figure 18:
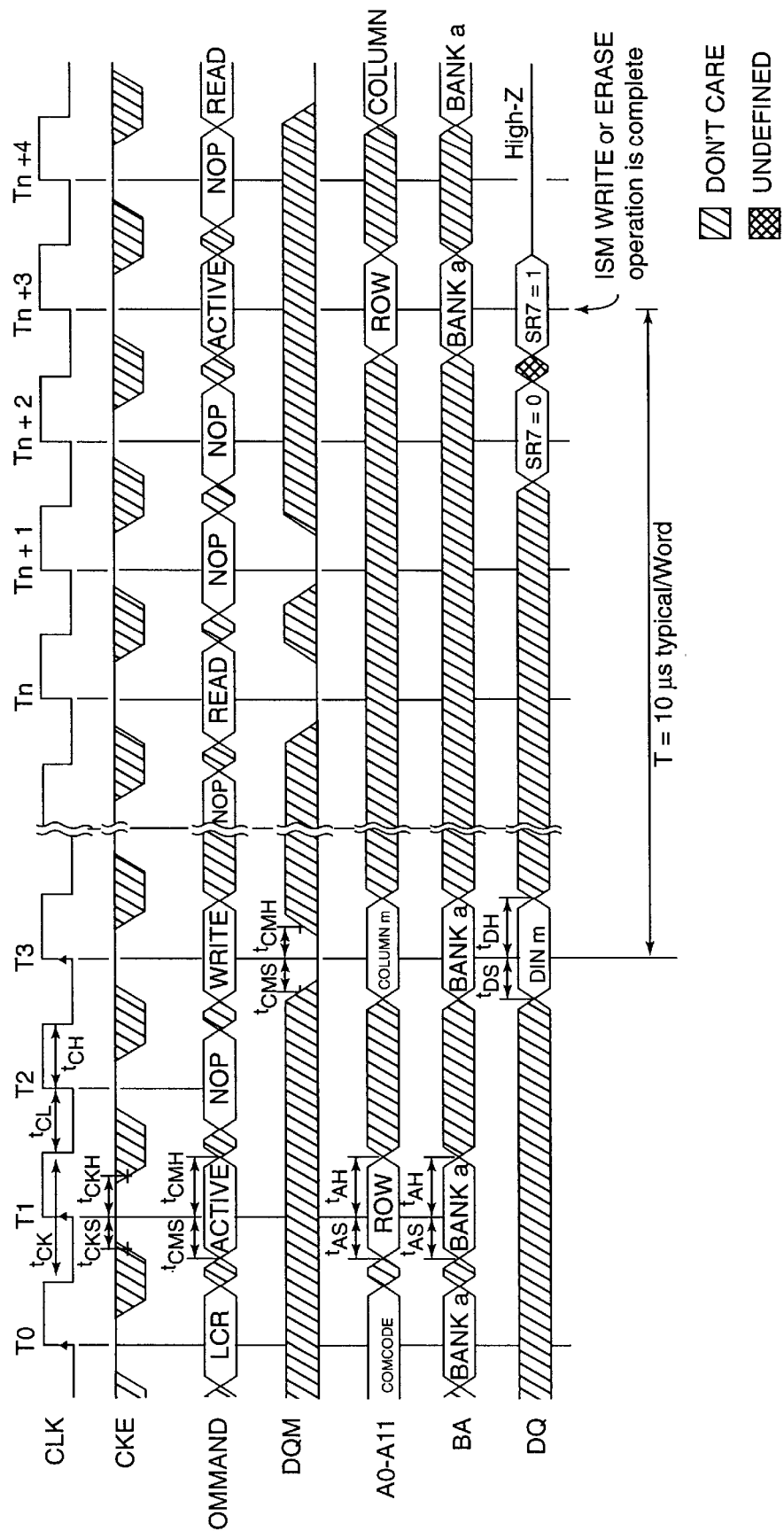
FIG. 18 illustrates the timing of a write operation followed by a read to the same bank.

Referring to FIG. 18, the timing of a write operation followed by a read to the same bank is illustrated. In this operation, a write is performed to bank A and a subsequent read is performed to bank A. A different row is accessed for the read operation, and the memory must wait for the prior write operation to be completed. This is different from the read of FIG. 17 where the read was not delayed due to the write operation.

Initialization

The synchronous flash memory has numerous non-volatile storage registers (fuse elements) that contain data used during operation, such as adjusting the internal settings of the device. Some of this information is required before any operation can be performed. Such information could include the location of memory rows or columns in the array that have been replaced with redundant elements. As such, this information must be read at power up.

In prior memories, a Vcc detector circuit could be used that would signal if the power applied to the device was high enough to read the register. Once the power was sufficient, then the circuitry could start to read these fuse elements and load them into some volatile registers. These Vcc detector circuits are not reliable such that the level that they detect varies widely. In a typical case, these detectors could change from a detection level of 1.4 v to 2.7 v depending on process and temperature variations. Thus, reading of the fuses needed to be done at a worst-case situation, and the circuitry is very complicated and large because reading Flash cells with 1.4 v is difficult.

The synchronous flash of the present invention is a device designed to replace a SDRAM. SDRAM's have long required a user to wait 100 μs after the supply power is applied to the chip and provide commands such as precharge commands.

In one embodiment, the present invention requires the memory controller of the system to issue a device initialize command to the memory. The Flash then would start reading data from fuse elements. Since the Vcc is good at that time, the device uses the normal circuits on the chip to do the data reads and is smaller and more effective. In one embodiment, therefore, the present invention receives an initialize command that indicates that Vcc is at an appropriate level. The memory then reads the non-volatile "fuses".

In another embodiment, the Flash memory uses the reset connection (RP#) to perform an initialization process. The RP connection is used for multiple functions in the memory. One function is to allow access to protection circuitry in the memory. By providing an elevated voltage on the RP connection, the device protection modes can be ignored, and the memory protect register can be edited. The RP connection is also used to reset the device on power-up. Here the RP pin receives a voltage that transitions to a de-asserted (high) state when the memory is powered up. The memory then begins an initialization process, including reading the fuses. The memory includes a "filter" that prevents an initialization sequence from being performed if the RP connection is not low for a predetermined time. For example, in one embodiment the RP connection must be low (Vss) for at least 100 ns prior to entering a reset/initialization operation. This time requirement prevents accidental reset due to noise on the RP connection.

Figure 19:
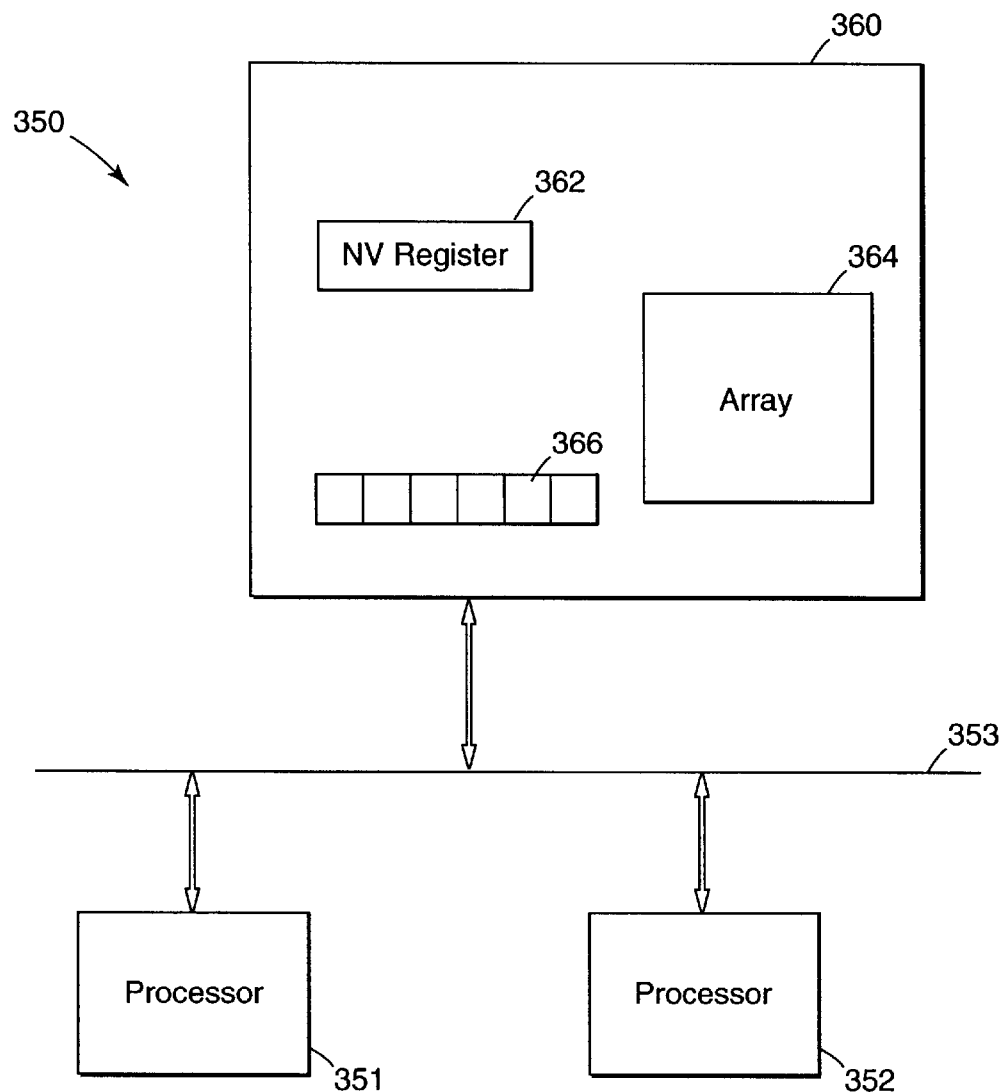
FIG. 19 illustrates a memory system according to one embodiment of the present invention.

Referring to FIG. 19, a system 350 according to one embodiment of the present invention is illustrated. The system includes a memory controller 352 coupled via a control bus 353 to a synchronous memory 360. A synchronous memory comprises non-volatile elements or fuses 362, control circuitry 364 to read a status of the plurality of non-volatile fuses during an initialization operation, and a reset connection 366 to receive an externally provided signal and trigger the initialization operation. The synchronous memory device further comprises filter circuitry 370 coupled to the reset connection to prevent triggering of the initialization operation if the externally provided signal does not have a duration that exceeds a predetermined minimum duration, such as 100 ns.

The present invention, therefore, can also perform initialization operations based on the RP connection. Two different initialization schemes can be used with the present synchronous Flash memory. The first uses an initialize command from the memory controller of the system. The second uses the RP connection to begin initialization. This embodiment reduces the need for the system to provide a specific command, which may be difficult in some systems.

Status Register With Concurrency

With the addition of Read While Write Capabilities of the present invention, the status register may not supply enough information. That is, the status register typically indicates whether the part is busy with a write operation, and whether there were any problems with an erase or program operation. The present invention uses a 4-bank architecture that may be busy writing to any one of the banks. The memory also has a series of other non-volatile registers that could be erased or programmed.

Referring to FIG. 19, a system 350 according to one embodiment of the present invention is illustrated. The system includes a first processor 351 and an optional second processor 352 coupled via a bus 353 to a synchronous memory 360. The synchronous memory comprises non-volatile elements or fuses 362, a memory cell array 364, and an n-bit status register 366.

The invention, therefore, uses some of the bits of the status register to indicate whether the ongoing operation affects the memory array or the other non-volatile registers. If the operation is affecting the memory array, two additional bits of the status register indicate which bank is being written to. If the operation is being performed on a non-volatile register(s), two or more additional bits signify which registers are being operated on. This invention allows for multiple processor systems to be able to read the status register and determine an exact status of operations throughout the device. Thus, the register has at least one bit programmed to indicate a write status of the memory, and bits programmed with an identification code of the location that is being written.

In one embodiment, a method of operating a memory device includes initiating a write operation on a bank of memory cells of an array. A first bit of a data register is programmed to a first state, such as a logic one, in response to the initiation of the write operation. The memory cell bank has an identification code that is programmed into a second set of bits of the data register in response to the initiation of the write operation. In a second embodiment, the method is provided while writing to a non-volatile register.

In a multi-processor system, a write operation is initiated on a bank of memory cells of an array with a first external processor. The write identifier and the bank identifier are programmed into the data register, as explained above. A second processor requests status data from the memory and the memory outputs data from the data register in response to the request from the second processor. In each method, the data register can be reset upon completion of the write operation.

Conclusion

A synchronous flash memory includes an array of non-volatile memory cells. The memory device has a package configuration that is compatible with an SDRAM. In one embodiment, the present invention can include a memory device comprising an array of memory cells arranged in addressable blocks and an n-bit status register. The memory includes a control circuit coupled to the n-bit status register to program a first bit of the n-bits to a first state indicating if a program operation is being performed on the array. The control circuit further programs second and third bits of the n-bits to identify one of the addressable blocks while the array is being programmed. A method of operating a memory device includes initiating a write operation on a first programmable location of the memory device using a first processor, and reading a status from status data stored in the memory device during the write operation. The status indicates an identification of the first programmable location.

What is claimed is:

1. A memory device comprising:

an array of memory cells arranged in addressable blocks;

an n-bit status register; and a control circuit coupled to the n-bit status register to program a first bit of the n-bits to a first state indicating if a program operation is being performed on the array, the control circuit further programs second and third bits of the n-bits to identify one of the addressable blocks while the array is being programmed.

2. The memory of claim 1 further comprising:

a programmable non-volatile register, wherein the control circuit programs the first bit to a first state indicating if a write operation is being performed on the non-volatile register, the control circuit further programs the second and third bits to identify the non-volatile register.

3. The memory device of claim 1 wherein the array of memory cells comprise non-volatile memory cells.

4. A memory device comprising:

an array of memory cells arranged in addressable blocks;

an n-bit status register;

a plurality of programmable non-volatile registers; and control circuitry coupled to the n-bit status register to program a first bit of the status register to a indicate a programming status of the memory device, the control circuit further programs second and third bits of the status register to identify one of the addressable blocks or one of the plurality of programmable non-volatile registers.

5. The memory device of claim 4 wherein the array of memory cells comprise non-volatile memory cells.

6. A memory system comprising:

a memory controller; and a memory device coupled to the memory controller and comprising, an array of memory cells arranged in addressable blocks, an n-bit status register having a first programmable bit indicting a write status of the memory device, and a plurality of second programmable bits identifying a first one of the addressable blocks, wherein the memory controller is coupled to read the n-bit status register.

7. The system of claim 6 wherein the memory device further comprises a programmable non-volatile register, and wherein the plurality of second programmable bits identify the non-volatile register.

8. A memory system comprising:
a memory controller; and
a memory device coupled to the memory controller and comprising,
an array of memory cells arranged in addressable blocks,
an n-bit status register,
a plurality of programmable non-volatile registers, and
control circuitry coupled to the n-bit status register to program a first bit of the status register to a indicate a programming status of the memory device, the control circuit further programs second and third bits of the status register to identify one of the addressable blocks or one of the plurality of programmable non-volatile registers.

9. A method of operating a memory device comprising:
modifying first data stored in a status register of the memory device to a first data state to indicate that a write operation is being performed on the memory device; and
modifying second data stored in the status register of the memory device to indicate a location of programmable circuitry in the memory device accessed during the write operation.

10. The method of claim 9 the programmable circuitry comprises memory cells located in an array, and data cells located in data registers.

11. A method of providing a write operation in a memory device comprising:
programming a first bit of a status register to a first state while data is being written to one of a plurality of locations in the memory device; and
programming a plurality of second bits of a status register with an identifier of the one of a plurality of locations.

12. The method of claim 11 wherein the plurality of locations comprise an array of non-volatile memory cells, and a non-volatile data register.

13. The method of claim 11 wherein the plurality of second bits of the status register comprise two bits.

14. The method of claim 11 further comprises providing a data content of the status register to an external processor in response to a request from the processor.

15. The method of claim 11 wherein the plurality of locations comprise an array of non-volatile memory cells arranged in a plurality of addressable banks.

16. The method of claim 15 wherein the plurality of addressable banks is four banks.

17. A method of operating a memory device, the method comprises:
initiating a write operation on a bank of memory cells of an array, where the bank has an identification code;
programming a first bit of a data register to a first state in response to the initiation of the write operation; and
programming the identification code in a second set of bits of the data register in response to the initiation of the write operation.

18. The method of claim 17 wherein a first external processor initiates the write operation.

19. The method of claim 18 further comprises outputting data from the first and second bits of the data register in response to a second external processor.

20. The method of claim 17 further comprising:
completing the write operation on the bank of memory cells; and
resetting the first bit of the data register to a second state in response to the completion of the write operation.

21. A method of operating a memory device, the method comprises:
initiating a write operation on a bank of memory cells of an array with a first external processor, where the bank has an identification code;
programming a first bit of a data register to a first state in response to the initiation of the write operation;
programming the identification code in a second set of bits of the data register in response to the initiation of the write operation;
requesting status data with a second external processor; and
outputting data from the first and second bits of the data register in response to the request from the second external processor.

22. The method of claim 21 further comprising:
completing the write operation on the bank of memory cells; and
resetting the first bit of the data register to a second state in response to the completion of the write operation.

23. A method of operating a memory device, the method comprises:
initiating a write operation on cells of a non-volatile register of an array, where the non-volatile register has an identification code;
programming a first bit of a data register to a first state in response to the initiation of the write operation; and
programming the identification code in a second set of bits of the data register in response to the initiation of the write operation.

24. The method of claim 23 wherein a first external processor initiates the write operation.

25. The method of claim 24 further comprises outputting data from the first and second bits of the data register in response to a second external processor.

26. The method of claim 23 further comprising:
completing the write operation on the non-volatile register; and
resetting the first bit of the data register to a second state in response to the completion of the write operation.

27. A method of operating a memory device, the method comprises:
initiating a write operation on a non-volatile register with a first external processor, where the non-volatile register has an identification code;
programming a first bit of a data register to a first state in response to the initiation of the write operation;

programming the identification code in a second set of bits of the data register in response to the initiation of the write operation;

requesting status data with a second external processor; and outputting data from the first and second bits of the data register in response to the request from the second external processor.

28. The method of claim 27 further comprising:

completing the write operation on the non-volatile register; and resetting the first bit of the data register to a second state in response to the completion of the write operation.

29. A method of operating a memory device comprising:

initiating a write operation on a first programmable location of the memory device using a first processor; and reading a status from status data stored in the memory device during the write operation, wherein the status indicates an identification of the first programmable location.

30. The method of claim 29 wherein the status data is stored in a status register.

31. The method of claim 29 wherein the first programmable location comprises either memory cells of a memory array or a non-volatile register.

* * * * *